United States Patent
Park et al.

(10) Patent No.: US 11,962,093 B2
(45) Date of Patent: Apr. 16, 2024

(54) ELECTRONIC DEVICE INCLUDING ANTENNA

(71) Applicant: Samsung Electronics Co., Ltd., Gyeonggi-do (KR)

(72) Inventors: Yongsun Park, Gyeonggi-do (KR); Jungmin Lee, Gyeonggi-do (KR); Hyunwoo Kwon, Gyeonggi-do (KR); Pilwon Seo, Gyeonggi-do (KR); Jiwoo Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 240 days.

(21) Appl. No.: 17/678,217

(22) Filed: Feb. 23, 2022

(65) Prior Publication Data

US 2022/0294125 A1    Sep. 15, 2022

Related U.S. Application Data

(63) Continuation of application No. PCT/KR2022/002402, filed on Feb. 18, 2022.

(30) Foreign Application Priority Data

Mar. 11, 2021   (KR) .................. 10-2021-0032242

(51) Int. Cl.
  *H01Q 21/06*   (2006.01)
  *H01Q 1/24*    (2006.01)
  *H01Q 21/28*   (2006.01)
(52) U.S. Cl.
  CPC .......... *H01Q 21/065* (2013.01); *H01Q 1/243* (2013.01); *H01Q 21/28* (2013.01)

(58) Field of Classification Search
  CPC ...... H01Q 21/065; H01Q 1/243; H01Q 21/28; H01Q 1/24; H01Q 5/25; H01Q 9/04;
  (Continued)

(56) References Cited

U.S. PATENT DOCUMENTS 11,415,727 B2 *   8/2022   Zhou ..................... G02B 7/021
11,600,904 B2 *   3/2023   Moon ..................... H01Q 21/08
(Continued)

FOREIGN PATENT DOCUMENTS

CN    106210194 A    12/2016
CN    106936950 A    7/2017
(Continued)

OTHER PUBLICATIONS

International Search Report dated May 31, 2022.

*Primary Examiner* — Seung H Lee
(74) *Attorney, Agent, or Firm* — Cha & Reiter, LLC

(57) ABSTRACT

According to an embodiment of the disclosure, an electronic device may include a first camera and a second camera, a communication circuit, a display, a rear plate disposed opposite to the display, an opening formed in a partial region of the rear plate including a first region in which the first camera and the second camera are disposed, and a second region configured to extend from at least a part of the first region, a first patch antenna disposed inside the first region and disposed adjacent to the second camera, and a second patch antenna disposed inside the second region and a third patch antenna disposed to be aligned with the second patch antenna in a first direction. The first patch antenna, the second patch antenna, and the third patch antenna may be arranged to be non-aligned. Other embodiments in addition to the embodiments disclosed herein may also be possible.

20 Claims, 14 Drawing Sheets

(58) Field of Classification Search
CPC .... H01Q 9/0407; H04M 1/02; H04M 1/0249; H04M 1/0264; H05K 5/03
See application file for complete search history.

(56) References Cited

U.S. PATENT DOCUMENTS

| | | |
|---|---|---|
| 2018/0192530 A1 | 7/2018 | Wang et al. |
| 2020/0021011 A1 | 1/2020 | Cooper et al. |
| 2020/0310489 A1 | 10/2020 | Spraggs et al. |
| 2022/0060230 A1 | 2/2022 | Na et al. |

FOREIGN PATENT DOCUMENTS

| | | |
|---|---|---|
| CN | 108600448 A | 9/2018 |
| CN | 112117524 A | 12/2020 |
| CN | 112164881 A | 1/2021 |
| KR | 10-2020-0031230 A | 3/2020 |
| KR | 10-2020-0115090 A | 10/2020 |

\* cited by examiner

ELECTRONIC DEVICE INCLUDING ANTENNA

CROSS-REFERENCE TO RELATED APPLICATION(S)

This application is a continuation based on and claims priority under 35 U.S.C. § 120 to PCT International Application No. PCT/KR2022/002402, which was filed on Feb. 18, 2022, and claims priority to Korean Patent Application No. 10-2021-0032242, filed on Mar. 11, 2021, in the Korean Intellectual Property Office, the disclosure of which are incorporated by reference herein their entirety.

BACKGROUND

Technical Field

One or more embodiments of the instant disclosure generally relate to an electronic device including an antenna.

Description of Related Art

As wireless communication technologies have developed, electronic devices have become widespread in everyday life, and the level of user demand has been increasing. Various types of wireless communication technologies may be used to satisfy such user demands. For example, wireless communication technologies may include at least one of ultra-wide band (UWB) communication, wireless fidelity (Wi-Fi) communication, long term evolution (LTE) communication, 5G communication (or new radio (NR) communication), or Bluetooth communication. Particularly, an electronic device supporting UWB communication may use at least three UWB antennas to measure the position (or distance, arrival of angle (AoA), etc.) of at least one external electronic device.

SUMMARY

An UWB antenna supporting UWB communication may have polarization characteristics. Accordingly, when the electronic device's exterior is made of a conductive member (for example, metal), the conductive member may degrade UWB communication signal quality. As a result, when electronic device's exterior is conductive, there may be difficulty in disposing multiple UWB antennas inside the electronic device.

An electronic device according to an embodiment of the disclosure may include a first camera and a second camera, a communication circuit, a display, a rear plate disposed opposite to the display, an opening formed in a partial region of the rear plate including a first region in which the first camera and the second camera are disposed, and a second region configured to extend from at least a part of the first region, a first patch antenna disposed inside the first region and disposed adjacent to the second camera, and a second patch antenna disposed inside the second region and a third patch antenna disposed to be aligned with the second patch antenna in a first direction, wherein the first patch antenna, the second patch antenna, and the third patch antenna are arranged to be non-aligned.

Additional aspects will be set forth in part in the description which follows and, in part, will be apparent from the description, or may be learned by practice of the presented embodiments.

BRIEF DESCRIPTION OF DRAWINGS

The above and other aspects, features, and advantages of certain embodiments of the present disclosure will be more apparent from the following description taken in conjunction with the accompanying drawings, in which.

DETAILED DESCRIPTION

According to certain embodiments of the disclosure, an opening may be formed to extend in one lateral direction of an electronic device and a camera may be disposed on the rear surface of an electronic device. The device's exterior may be conductive, and multiple UWB antennas may be disposed inside the opening formed to extend in the one lateral direction.

According to certain embodiments of the disclosure, multiple UWB antennas for UWB communication are disposed inside an opening formed on the rear surface of an electronic device whose exterior is made of a conductive member. This way, UWB communication can be performed through the multiple UWB antennas. Moreover, disposition of UWB antennas for UWB communication inside the opening formed on the rear surface of the electronic device may prevent degradation of radiation performance of the UWB antennas due to the conductive member. As a result, the electronic device may accurately measure the distance and/or AoA from an external electronic device.

Figure 1:
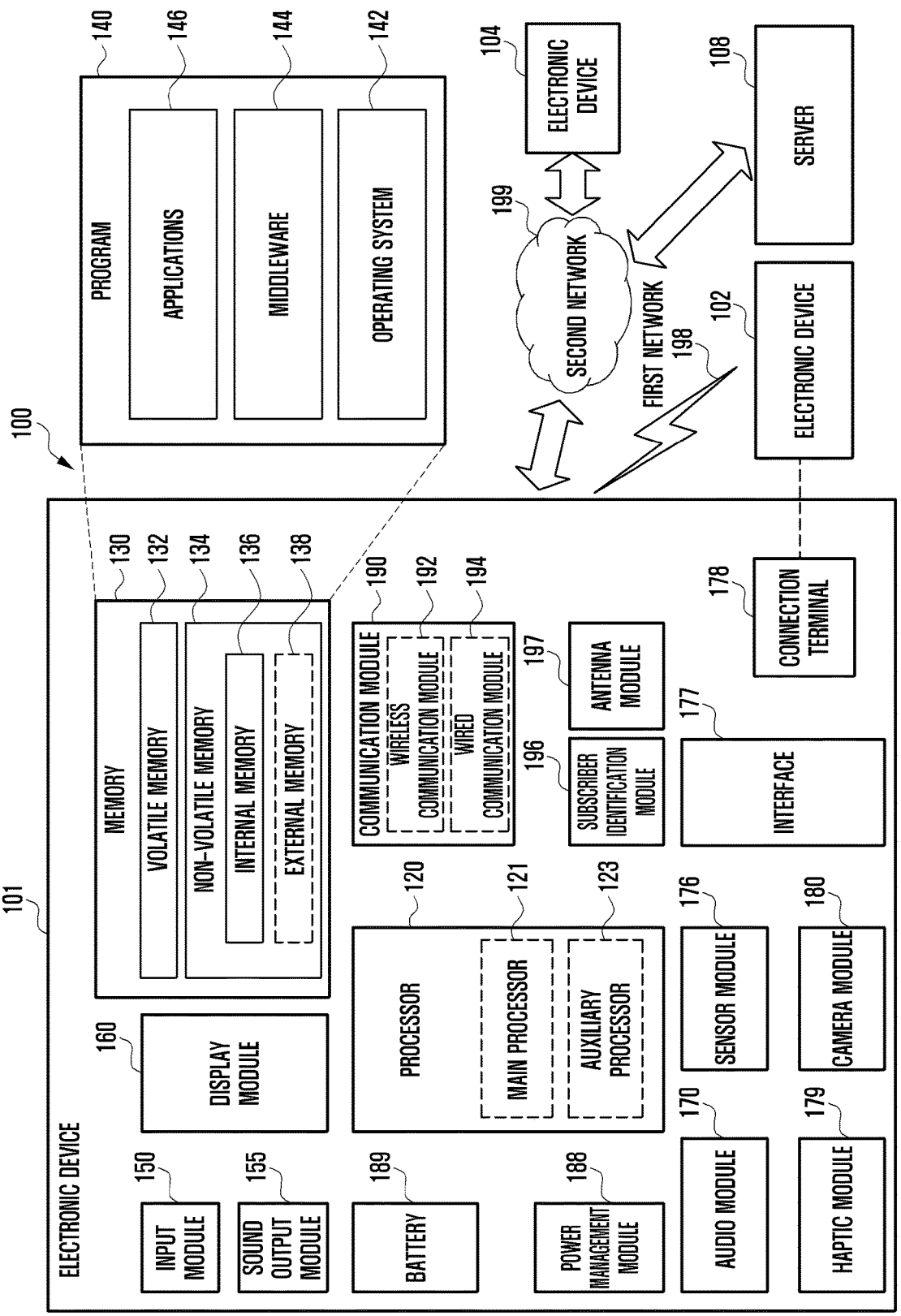
FIG. 1 is a block diagram of an electronic device in a network environment according to an embodiment.

FIG. 1 is a block diagram illustrating an electronic device 101 in a network environment 100 according to an embodiment.

Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connection terminal 178, a haptic module 179, a camera module 180, a power management module 188, a battery 189, a communication module 190, a subscriber identification module (SIM) 196, or an antenna module 197. In some embodiments, at least one of the components (e.g., the connection terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 and/or an external memory 138.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) (e.g., speaker or headphone) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., through wires) or wirelessly. According to an embodiment, the interface 177 may include, for example, a high-definition multimedia interface (HDMI), a universal serial bus (USB) interface, a secure digital (SD) card interface, or an audio interface.

The connection terminal 178 may include a connector via which the electronic device 101 may be physically connected with the external electronic device (e.g., the electronic device 102). According to an embodiment, the connection terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., an application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, Wi-Fi direct, or infrared data association (IrDA)) or the second network 199 (e.g., a long-range communication network, such as a legacy cellular network, a fifth generation (5G) network, a next-generation communication network, the Internet, or a computer network (e.g., LAN or wide area network (WAN))). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large-scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to certain embodiments, the antenna module 197 may form mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., an mmwave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively," as "coupled with," "coupled to," "connected with," or "connected to" another element (e.g., a second element), it means that the element may be coupled with the other element directly (e.g., through wires), wirelessly, or via a third element.

According to certain embodiments, each component (e.g., a module or a program) of the above-described components may include a single entity or multiple entities, and some of the multiple entities may be separately disposed in different components. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration.

Figure 2:
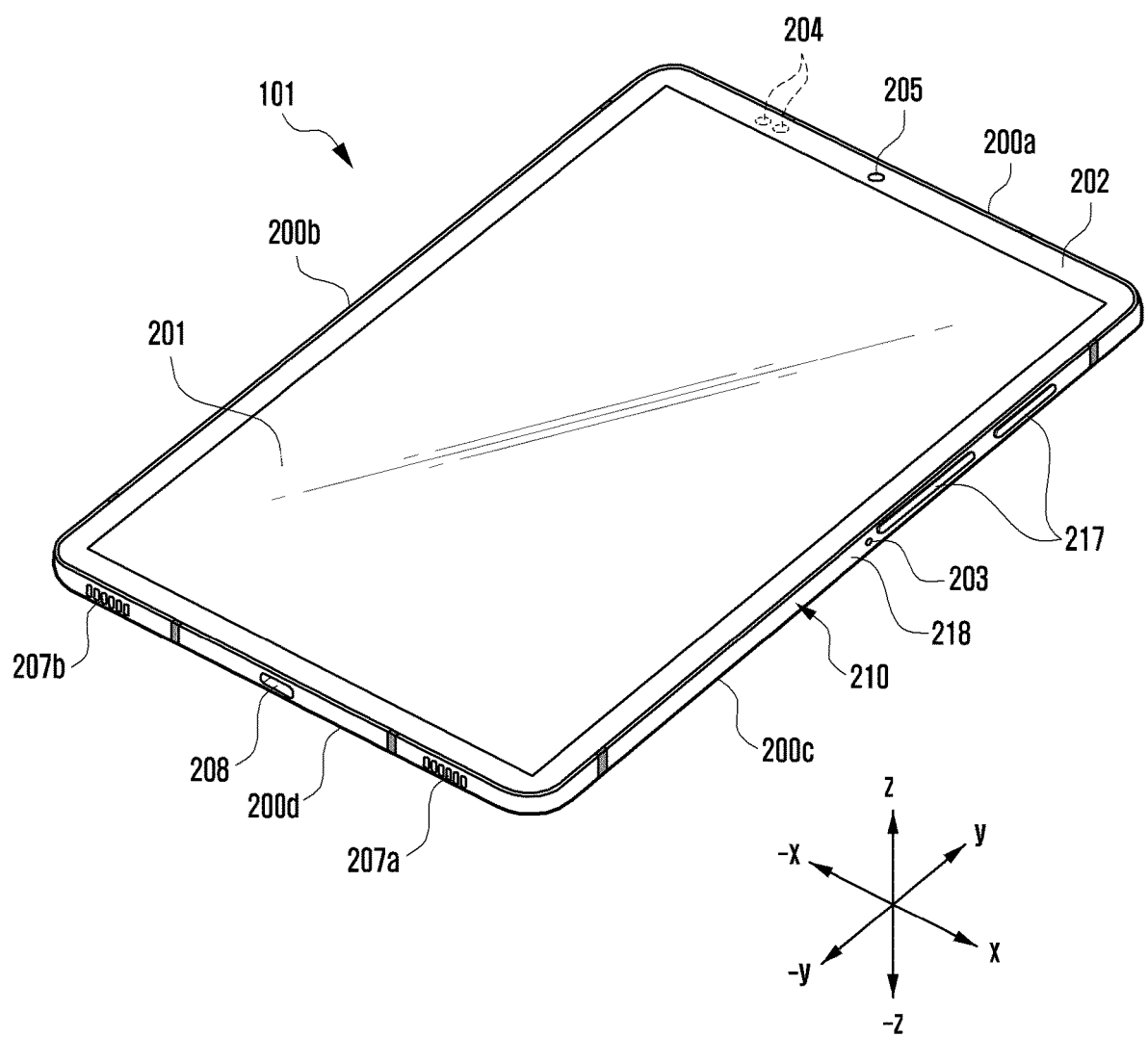
FIG. 2 is a front perspective view of an electronic device according to an embodiment.
Figure 3:
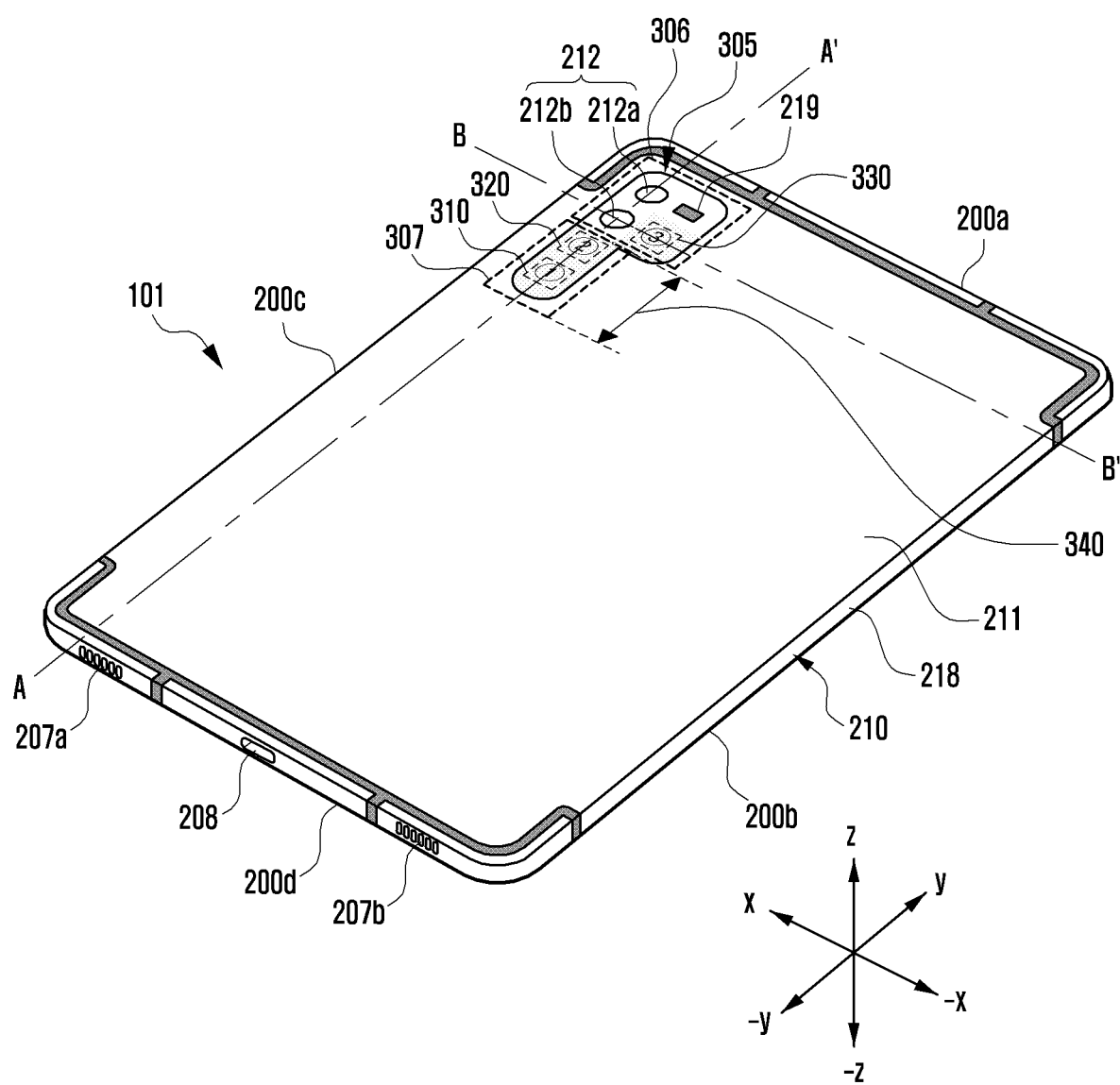
FIG. 3 is a rear perspective view of the electronic device of FIG. 2 according to an embodiment.

FIG. 2 is a front perspective view of an electronic device 101. FIG. 3 is a rear perspective view of the electronic device of FIG. 2 according to an embodiment.

Referring to FIGS. 2 and 3, the electronic device 101 may include a housing 210 that includes a front plate 202 facing a first direction (i.e., the Z-axis direction), a rear plate 211 facing a direction (i.e., the −Z-axis direction) opposite to the first direction, and a lateral member 218 surrounding an inner space between the front plate 202 and the rear plate 211. For example, the lateral member 218 has a first side surface 200a of a first length, and a second side surface 200b extending from the first surface 200a in a direction (e.g., the −y-axis direction) vertical thereto and having a second length longer than the first length, a third side surface 200c extending in the direction parallel to the second side surface 200b from the first side surface 200a and having the second length, and a fourth side surface 200d extending in the direction parallel to the first side surface 200a from the second side surface 200b and having the first length.

According to an embodiment, the front plate 202 may be made of, for example, a glass plate comprising various coating layers or polymer plate. The rear plate 211 may be made of, for example, coated or colored glass, ceramic, polymer, metal (e.g., aluminum, stainless steel (STS), or magnesium), or any combination thereof. The lateral member 218 may be combined with the front plate 202 and the rear plate 211 and may include metal and/or polymer. In some embodiments, the rear plate 211, the front plate 202, and the lateral member 218 may be integrated together and may be of the same material (e.g., metallic material such as aluminum). For example, the rear plate 211 of the electronic device 101 may be integrated with the front plate 202 and the lateral member 218 to cover the housing 210 while exposing the display 201.

The electronic device 101 may include at least one of a display 201 (e.g., display module 160 of FIG. 1), audio modules 203, 207a, and 207b (e.g., audio module 170 of FIG. 1), a sensor module 204 (e.g., sensor module 176 of FIG. 1), camera modules 205 and 212 (212a and 112b) (e.g., camera module 180 of FIG. 1), a key input device 217 (e.g., input device 150 of FIG. 1), or a connector hole 208. In some embodiments, the electronic device 101 may omit at least one of the above-listed components (e.g., the key input device 217) or further include any other component.

The display 201 may be exposed through a considerable portion of the front plate 202. In another embodiment, edges and corners of the display 201 may be formed to substantially resemble adjacent outlines of the front plate 202. In still another embodiment, in order to maximize the exposed area of the display 201, the gap between edges of the display 201 and corresponding edges of the front plate 202 may be substantially constant.

In further another embodiment (not shown), a recess or opening may be formed in a portion of a display area of the display 201 to accommodate at least one of the sensor module 204 and the camera module 205. At least one of the sensor module 204, the camera module 205, and a fingerprint sensor (not shown) may be disposed on the back of the display area of the display 201. The display 201 may be combined with, or adjacent to, a touch sensing circuit, a pressure sensor capable of measuring the touch strength (pressure), and/or a digitizer for detecting a stylus pen.

The audio modules 203, 207a and 207b may include a microphone hole 203 and speaker holes 207a and 207b. The microphone hole 203 may contain a microphone disposed therein for acquiring external sound or alternatively contain a plurality of microphones so that sound direction can be detected. The speaker holes 207a and 207b may be classified into an external speaker hole and/or a call receiver hole. The microphone hole 203 and the speaker holes 207a and 207b may be implemented as a single hole, or a speaker (e.g., piezo speaker) may be provided without the speaker holes 207a and 207b.

The sensor module 204 may generate electrical signals or data values corresponding to internal operating states or external environmental states of the electronic device 101. The sensor module 204 may include at least one of a gesture sensor, a gyro sensor, a barometric sensor, a magnetic sensor, an acceleration sensor, a grip sensor, a color sensor, an infrared (IR) sensor, a biometric sensor, a temperature sensor, a humidity sensor, or an illuminance sensor.

The key input device 217 may be disposed through the lateral member 218 of the housing 210. In a certain embodiment, some or all of the key input device 217 may be implemented as soft keys displayed on the display 201. In another embodiment, the key input device 217 may be implemented using a pressure sensor included in the display 201. In still another embodiment, the key input device 217 may include at least one pressure-sensitive key using a strain gauge disposed in the electronic device 101 and measuring pressure changes on the lateral member 218.

According to an embodiment, the connector hole 208 may accommodate a connector (e.g., USB connector or IF connector) for transmitting and receiving power, data, and/or sound signals to and from an external electronic device (e.g., the electronic devices 102 and 104 of FIG. 1).

The camera modules 205 and 212 (212a and 112b) may include a first camera module 205 disposed to be exposed to the exterior through the front plate 202 of the electronic device 101, and second camera module 212 (212a and 112b) disposed to be exposed to the exterior through the rear plate 211. According to an embodiment, the rear camera modules 212a and 212b may be adjacent to each other and thus disposed as one camera module assembly 212. For example, a pair of the camera modules 212a and 212b in the camera module assembly 212 may perform a dual camera function for general shooting, wide-angle shooting, or ultra-wide-angle shooting.

In an embodiment, an opening 305 may be formed in a partial region of the rear plate 211. The opening 305 may be in a polygonal shape. For example, the opening 305 may include a first region 306 having a quadrilateral shape and a second region 307 extending in a first length 340 from at least a part of the first region 306 in one side direction (e.g., the −y-axis direction). The shape of the opening 305 may not be limited to the above.

In an embodiment, a first camera 212a, a second camera 212b, and/or a flash 219 may be arranged inside the quadrilateral-shaped first region 306 of the opening 305. But the arrangement of the cameras is not limited to the above.

In addition, even though not shown, other multiple cameras (e.g., time of flight (TOF) camera, wide-angle camera, telephoto camera, and/or close-up camera), a microphone and/or a microphone hole may be arranged inside the quadrilateral-shaped first region 306 of the opening 305.

In an embodiment, the electronic device 101 may include an ultra-wide band (UWB) antenna (e.g., the antenna module 197 of FIG. 1) in a high-frequency band corresponding to a UWB communication protocol. The UWB antenna may include a first patch antenna 310, a second patch antenna 320, and a third patch antenna 330. For example, one patch antenna of the first patch antenna 310, the second patch antenna 320, and the third patch antenna 330 may be used as a patch antenna for transmitting or receiving UWB signals, and the two remaining patch antennas may be used as patch antennas for receiving UWB signals.

In an embodiment, at least one patch antenna of the first patch antenna 310, the second patch antenna 320, and the third patch antenna 330 may be disposed inside the first region 306 of the opening 305. The remaining patch antennas may be arranged inside the second region 307 of the opening 305.

For example, the third patch antenna 330 may be disposed inside the first region 306 of the opening 305. The first patch antenna 310 and the second patch antenna 320 may be arranged inside the second region 307 of the opening 305. However, the arrangement of the patch antennas is not limited to the above.

In an embodiment, the first patch antenna 310 and the second patch antenna 320 may be arranged to be aligned in a first direction (e.g., the y-axis direction). The third patch antenna 330 may be disposed to be non-aligned with the first patch antenna 310 and the second patch antenna 320.

In an embodiment, the rear plate 211 may include a window glass disposed at the position corresponding to the first region 306 of the opening 305 to protect the first camera 212a, the second camera 212b, and the third patch antenna 330. The window glass may be disposed to protrude from the surface of the rear plate 211. However, the instant disclosure is not so limited, and the window glass may be disposed to be flush with the surface of the rear plate 211, for example.

In an embodiment, the window glass may include a transparent glass and an opaque window glass. For example, in the first region 306 of the opening 305, the transparent window glass may be disposed at the position corresponding to the region in which the first camera 212a and the second camera 212b are arranged. In the first region 306 of the opening 305, the opaque window glass may be disposed at the position corresponding to the region in which the third patch camera 330 is disposed. In an embodiment, the opaque window glass may be formed by using film and/or glass coating on glass.

In an embodiment, the rear plate 211 may include an opaque injection member disposed at the position corresponding to the second region 307 of the opening 305. For example, in order to prevent the second region 307 of the opening 305 from being exposed, the injection member may be disposed at the position corresponding to the second region 307 of the opening 305. In an embodiment, the injection member may be coated with the same color as the rear plate 211. However, the instant disclosure is not so limited, and a cover member, which covers a camera (e.g., the first camera 212a and the second camera 212b) and is different from the glass window, may be further coupled onto the injection member.

In an embodiment, the glass window and the injection member may be made of a non-conductive material.

In an embodiment, due to the first patch antenna 310, the second patch antenna 320, and the third patch antenna 330 for UWB communication being arranged inside the opening 305 of the rear plate 211 of the electronic device 101, while also being covered by the non-conductive glass window and injection member, even when the rear plate 211 is made of a conductive material (e.g., metal), stable UWB communication may be performed using the first patch antenna 310, the second patch antenna 320, and/or the third patch antenna 330.

Certain embodiments disclosing various shapes of the opening 305 formed through the rear plate 211 of the electronic device 101 and/or various arrangements of the first patch antenna 310, the second patch antenna 320, and the third patch antenna 330 inside the opening 305 will be described in connection with FIG. 4 to FIG. 14 below.

Figure 4:
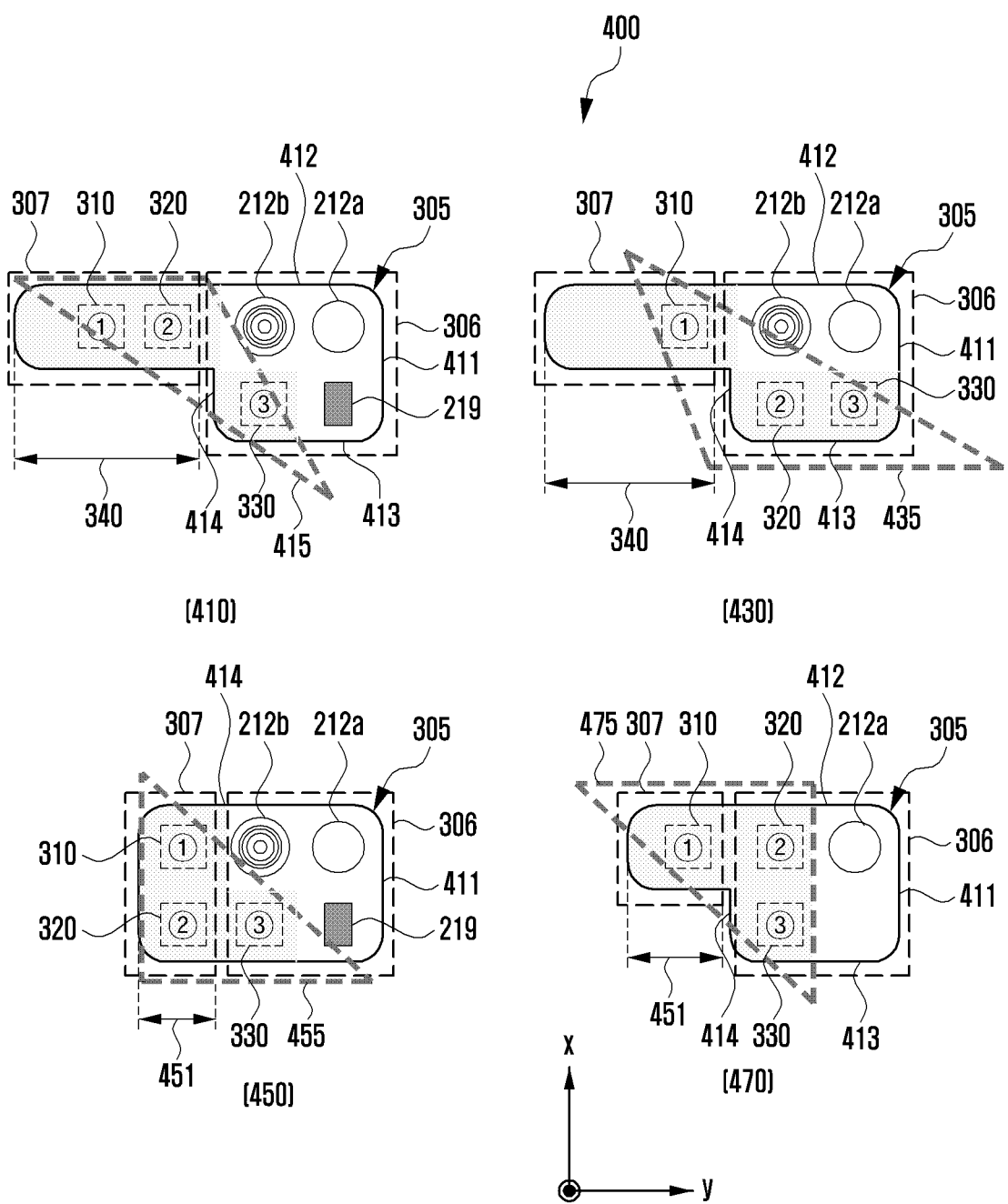
FIG. 4 is a view illustrating arrangements of a first patch antenna to a third patch antenna in a rear plate of an electronic device according to certain embodiments.

FIG. 4 is a view 400 illustrating arrangements of a first patch antenna to a third patch antenna 310, 320, and 330 in a rear plate 211 of an electronic device 101 according to certain embodiments.

Referring to FIG. 4, reference numeral <410> is an enlarged view of the opening 305 illustrated in FIG. 3 described above. As described in FIG. 3 described above, the opening 305 formed through a rear plate (e.g., the rear plate 211 of FIG. 3) of an electronic device (e.g., the electronic device 101 of FIG. 1), as illustrated in reference numeral <410>, may include the first region 306 having a quadrilateral shape and the second region 307 extending in one side direction (e.g., the -y-axis direction) from at least a part of the first region 306 in the first length 340. For example, the first region 306 may include a first side 411 parallel to a first side surface 200a of the electronic device 101, a second side 412 extending from the first side 411 in a direction (e.g., the -y-axis direction) vertical thereto, a third side 413 extending from the first side 411 in a direction parallel to the second side 412, and a fourth side 414 extending from the second side 412 in the direction parallel to the first side 411. The second region 307 may extend in one side direction (e.g., the -y-axis direction) from at least a part of the fourth side 414 of the first region 306 in the first length 340. For example, the shape of the opening 305 according to an embodiment of reference numeral <410> may be the "¬" shape.

In an embodiment, a first camera 212a and a second camera 212b may be arranged to be aligned in the first direction (e.g., the y-axis direction) inside the first region 306 of the opening 305. The first camera 212a and the second camera 212b may be used as a dual camera system for general photographing, wide-angle photographing, and/or ultra-wide-angle photographing. However, the instant disclosure is not so limited, and at least one of the first camera 212a and the second camera 212b may include a folded zoom camera capable of optically zooming in on a distant subject by using multiple lenses.

In an embodiment, the third patch antenna 330 may be further disposed inside the first region 306 of the opening 305. For example, the third patch antenna 330 may be disposed below (e.g., the -x-axis direction) the second camera 212b inside the first region 306 of the opening 305.

The flash 219 may be further disposed inside the first region 306 of the opening 305. The flash 219 may be disposed below (e.g., the -x-axis direction) the first camera 212a inside the first region 306 of the opening 305.

In an embodiment, the second patch antenna 320 and the third patch antenna 330 may be arranged inside the second region 307 of the opening 305. For example, the second patch antenna 320 and the third patch antenna 330 may be arranged to be aligned in the first direction (e.g., the y-axis direction).

In an embodiment, the third patch antenna 330, which is disposed inside the first region 306 of the opening 305, may be disposed to be non-aligned with or offset from the first patch antenna 310 and the second patch antenna 320. For example, the first patch antenna 310 and the second patch antenna 320, which are arranged inside the second region 307 of the opening 305, may be arranged to be aligned with the first camera 212a and the second camera 212b, which are arranged inside the first region 306 of the opening 305, in the first direction (e.g., the y-axis direction). The third patch antenna 330, which is disposed inside the first region 306 of the opening 305, may be disposed below the second camera 212b, in a direction (e.g., the -x-axis direction) perpendicular to the first direction, and thus may be non-aligned with or offset from the first patch antenna 310 and the second patch antenna 320.

In an embodiment, the rear plate 211 may include a window glass disposed at the position corresponding to the first region 306 of the opening 305 to protect the first camera 212a, the second camera 212b, and the first patch antenna 310. For example, the rear plate 211, in the first region 306 of the opening 305, may include a transparent window glass disposed at the position corresponding to the region in which the first camera 212a and the second camera 212b are arranged, and an opaque window glass disposed at the position corresponding to the region in which the third patch antenna 330 is disposed. The rear plate 211 may include an opaque injection member disposed at the position corresponding to the second region 307 of the opening 305.

In an embodiment, the first patch antenna 310, the second patch antenna 320, and/or the third patch antenna 330 may be used as the antenna 415 for measuring AoA with an external electronic device. For example, the electronic device 101 may be configured to measure the distance from and/or the AoA with an external electronic device, by transmitting a ranging signal to the external electronic device and/or receiving a ranging response signal from an external electronic device using the first patch antenna 310, the second patch antenna 320, and/or the third patch antenna 330.

In an embodiment, as illustrated in reference numeral <430>, identical to reference numeral <410>, the opening 305, which is formed through the rear plate 211 of the electronic device 101, may include the first region 306 having a quadrilateral shape and the second region 307 extending in one side direction (e.g., the -y-axis direction) from at least a part (e.g., at least a part of the fourth side 414) of the first region 306 in the first length 340.

In an embodiment, the first camera 212a and the second camera 212b may be arranged to be aligned in the first direction (e.g., the y-axis direction) inside the first region 306 of the opening 305. The second patch antenna 320 and the third patch antenna 330 may be further arranged inside the first region 306 of the opening 305. For example, the second patch antenna 320 may be disposed below (e.g., the -x-axis direction) the second camera 212b inside the first region 306 of the opening 305. The third patch antenna 330 may be disposed below (e.g., the –x-axis direction) the first camera 212a inside the first region 306 of the opening 305.

In an embodiment, the first patch antenna 310 may be disposed inside the second region 307 of the opening 305.

In an embodiment, the first patch antenna 310, which is disposed inside the second region 307 of the opening 305, may be disposed to be non-aligned with the second patch antenna 320 and the third patch antenna 330 which are arranged inside the first region 306 of the opening 305.

In an embodiment, the first patch antenna 310, the second patch antenna 320, and/or the third patch antenna 330 may be used as the antenna 435 for measuring AoA with an external electronic device. For example, the electronic device 101 may be configured to measure the distance from and/or the AoA angle with an external electronic device, by transmitting a ranging signal to an external electronic device and/or receiving a ranging response signal from an external electronic device using the first patch antenna 310, the second patch antenna 320, and/or the third patch antenna 330.

In an embodiment, as illustrated in reference numeral <450>, the opening 305, which is formed through the rear plate 211 of the electronic device 101, may include the first region 306 having a quadrilateral shape and the second region 307 extending in a direction (e.g., the –y-axis direction) from one side surface (e.g., the fourth side 414) of the first region 306 in a second length 451 smaller than the first length 340. In an embodiment, the shape of the opening 350 as illustrated in reference numeral <450> may be rectangular compared to the "¬" shape as illustrated in reference numeral <410>.

In an embodiment, the first camera 212a and the second camera 212b may be arranged to be aligned in the first direction (e.g., the y-axis direction) inside the first region 306 of the opening 305.

In an embodiment, the third patch antenna 330 may be further disposed inside the first region 306 of the opening 305. For example, the third patch antenna 330 may be disposed below (e.g., the –x-axis direction) the second camera 212b inside the first region 306 of the opening 305. The flash 219 may be further disposed inside the first region 306 of the opening 305. The flash 219 may be disposed below (e.g., the –x-axis direction) the first camera 212a inside the first region 306 of the opening 305.

In an embodiment, the first patch antenna 310 and the second patch antenna 320 may be arranged inside the second region 307 of the opening 305.

In an embodiment, the first patch antenna 310 and the second patch antenna 320, which are arranged inside the second region 307 of the opening 305, may be arranged to be aligned in a direction (e.g., the –x-axis direction) perpendicular to the first direction (e.g., the y-axis direction). The second patch antenna 320, which is disposed inside the second region 307 of the opening 305, may be disposed to be aligned with the third patch antenna 330 disposed inside the first region 306 of the opening 305 in the first direction (e.g., the y-axis direction). In other words, the first patch antenna 310 may be disposed to be non-aligned with the second patch antenna 320 and the third patch antenna 330.

In an embodiment, the first patch antenna 310, the second patch antenna 320, and/or the third patch antenna 330 may be used as an antenna 455 for measuring AoA. For example, the electronic device 101 may be configured to measure an angle in a vertical direction (e.g., an angle in the x-axis direction, such as an elevation angle of arrival of angle (AoA)) by using the first patch antenna 310 and the second patch antenna 320. In another example, the electronic device 101 may be configured to measure an angle in a horizontal direction (e.g., an angle in the y-axis direction such as an azimuth angle of AoA) by using the second patch antenna 320 and the third patch antenna 330. In other words, the first patch antenna 310, the second patch antenna 320, and/or the third patch antenna 330 may be used as the antenna 455 for measuring AoA (e.g., an azimuth angle (left/right angle) and/or an elevation angle (up/down angle)).

In an embodiment, even though it is described that the first patch antenna 310, the second patch antenna 320, and/or the third patch antenna 330 measure AoA angles (e.g., azimuth angle (left/right angle) and/or elevation angle (e.g., up/down angle)), the instant disclosure is not so limited.

In an embodiment, the electronic device 101, based on the orientation of the electronic device 101, may be configured to activate two patch antennas for measuring AoA such as the azimuth angle. For example, the electronic device 101 may identify the orientation of the electronic device 101, based on sensor data received through a sensor circuit (e.g., the sensor module 176 of FIG. 1). The orientation of the electronic device 101 may include a portrait mode (e.g., in FIG. 2, the state in which the first side surface 200a of the electronic device 101 is disposed toward the y-axis) and a landscape mode (e.g., in FIG. 2, the state in which the first side surface 200a of the electronic device 101 is disposed toward the x-axis) of the electronic device 101.

In an embodiment, when the orientation of the electronic device 101 is the portrait mode, the electronic device 101 may be configured to measure an angle (e.g., angle in the x-axis direction or azimuth angle of AoA) in the horizontal direction by using the first patch antenna 310 and the second patch antenna 320. When it is detected through the sensor circuit 176 that the electronic device 101 is reoriented into the landscape mode, the electronic device 101 may be configured to switch the patch antenna activated such that an angle (e.g., angle in the y-axis direction or azimuth angle of AoA) in the horizontal direction is measured using the second patch antenna 320 and the third patch antenna 330.

In an embodiment, the electronic device 101, based on the orientation of the electronic device 101, may be configured to activate two patch antennas for measuring AoA such as elevation angle. For example, when the orientation of electronic device 101 is the portrait mode, the electronic device 101 may be configured to measure an angle (e.g., angle in the y-axis direction or elevation angle of AoA) in the vertical direction by using the second patch antenna 320 and the third patch antenna 330. When it is detected through the sensor circuit 176 that the electronic device 101 is reoriented into the landscape mode, the electronic device 101 may be configured to switch the patch antenna activated such that an angle (e.g., angle in the x-axis direction or elevation angle of AoA) in the vertical direction is measured using the first patch antenna 310 and the second patch antenna 320.

In an embodiment, the electronic device 101 may be configured to measure the distance from and/or AoA with an external electronic device, by transmitting a ranging signal to an external electronic device and/or receiving a ranging response signal from an external electronic device using the first patch antenna 310, the second patch antenna 320, and/or the third patch antenna 330. For example, one patch antenna of the first patch antenna 310, the second patch antenna 320, and the third patch antenna 330 may be used as the patch antenna for transmitting or receiving UWB signals, and the two remaining patch antennas may be used as patch antennas for receiving UWB signals. For example, if it is described under the assumption that the second patch antenna 320 is a patch antenna for transmitting or receiving a ranging signal, the electronic device 101 may be configured to transmit a ranging signal to an external electronic device by using the second patch antenna. In response to transmitting the ranging signal, the electronic device 101 may be configured to receive a ranging response signal from the external electronic device by using the first patch antenna 310, the second patch antenna 320, and the third patch antenna 330.

In an embodiment, as illustrated in reference numeral <470>, the opening 305, which is formed through the rear plate 211 of the electronic device 101, may include the first region 306 having a quadrilateral shape and the second region 307 extending in one side direction (e.g., the −y-axis direction) from at least a part (e.g., at least a part of the fourth side 414) of the first region 306 in the second length 451 smaller than the first length 340. For example, the shape of the opening 305 according to an embodiment of reference numeral <470> may be a "¬" shape.

In an embodiment, the first camera 212a, the second patch antenna 320, and the third patch antenna 330 may be arranged inside the first region 306 of the opening 305. For example, the third patch antenna 330 may be disposed below (e.g., the −x-axis direction) of the second patch antenna 320, and thus the second patch antenna 320 and the third patch antenna 330 may be arranged to be aligned in a direction perpendicular to the first direction (e.g., the y-axis direction).

In an embodiment, the first patch antenna 310 may be disposed inside the second region 307 of the opening 305.

In an embodiment, the first patch antenna 310, which is disposed inside the second region 307 of the opening 305, may be disposed to be aligned with the second patch antenna 320 disposed inside the first region 306 of the opening 305 in the first direction (e.g., the y-axis direction).

In an embodiment, the first patch antenna 310, the second patch antenna 320, and/or the third patch antenna 330 may be used as the antenna 475 for measuring AoA. For example, the electronic device 101 may be configured to measure an angle (e.g., angle in the y-axis direction or azimuth angle of AoA) in the horizontal direction by using the first patch antenna 310 and the second patch antenna 320 which are arranged to be aligned in the first direction (e.g., the y-axis direction). The electronic device 101 may be configured to measure an angle (e.g., angle in the x-axis direction or elevation angle of AoA) in the vertical direction by using the second patch antenna 320 and the third patch antenna 330 which are arranged to be aligned in a direction (e.g., the x-axis direction) perpendicular to the first direction (e.g., the y-axis direction). The electronic device 101 may be configured to measure the distance and/or angle with an external electronic device, by transmitting a ranging signal to the external electronic device and/or receiving a ranging response signal from the external electronic device using the first patch antenna 310, the second patch antenna 320, and/or the third patch antenna 330.

In an embodiment, the electronic device, based on an orientation of the electronic device 101, may be configured to activate two patch antennas for measuring AoA, such as the azimuth angle or the elevation angle.

For example, when the orientation of electronic device 101 is the portrait mode, the electronic device 101 may be configured to measure an angle (e.g., angle in the x-axis direction or azimuth angle of AoA) in a horizontal direction by using the first patch antenna 310 and the second patch antenna 320. When it is detected through the sensor circuit 176 that the electronic device 101 is reoriented into the landscape mode, the electronic device 101 may be configured to switch the patch antenna activated such that an angle (e.g., angle in the y-axis direction or azimuth angle of AoA) in the horizontal direction is measured using the first patch antenna 310 and the second patch antenna 320.

In another example, when the orientation of electronic device 101 is the portrait mode, the electronic device 101 may be configured to measure an angle (e.g., angle in the y-axis direction or elevation angle of AoA) in a vertical direction by using the first patch antenna 310 and the second patch antenna 320. When it is detected through the sensor circuit 176 that the electronic device 101 is reoriented into the landscape mode, the electronic device 101 may be configured to switch the patch antenna activated such that an angle (e.g., angle in the x-axis direction or elevation angle of AoA) in the vertical direction is measured using the second patch antenna 320 and the third patch antenna 330.

In an embodiment, inside the opening 305, which is covered by a glass window and a non-conductive injection member, of the rear plate 211 of the electronic device 101 whose outer periphery is made of a conductive material (e.g., metal), two patch antennas of the first patch antenna 310, the second patch antenna 320, and the third patch antenna 330 for UWB communication may be arranged to be aligned with each other and another one may be disposed to be non-aligned therewith, and thus the electronic device 101 can accurately measure AoA with an external electronic device, by being capable of measuring an angle in the horizontal direction and/or an angle in the vertical direction using the first patch antenna 310, the second patch antenna 320, and the third patch antenna 330.

Figure 5:
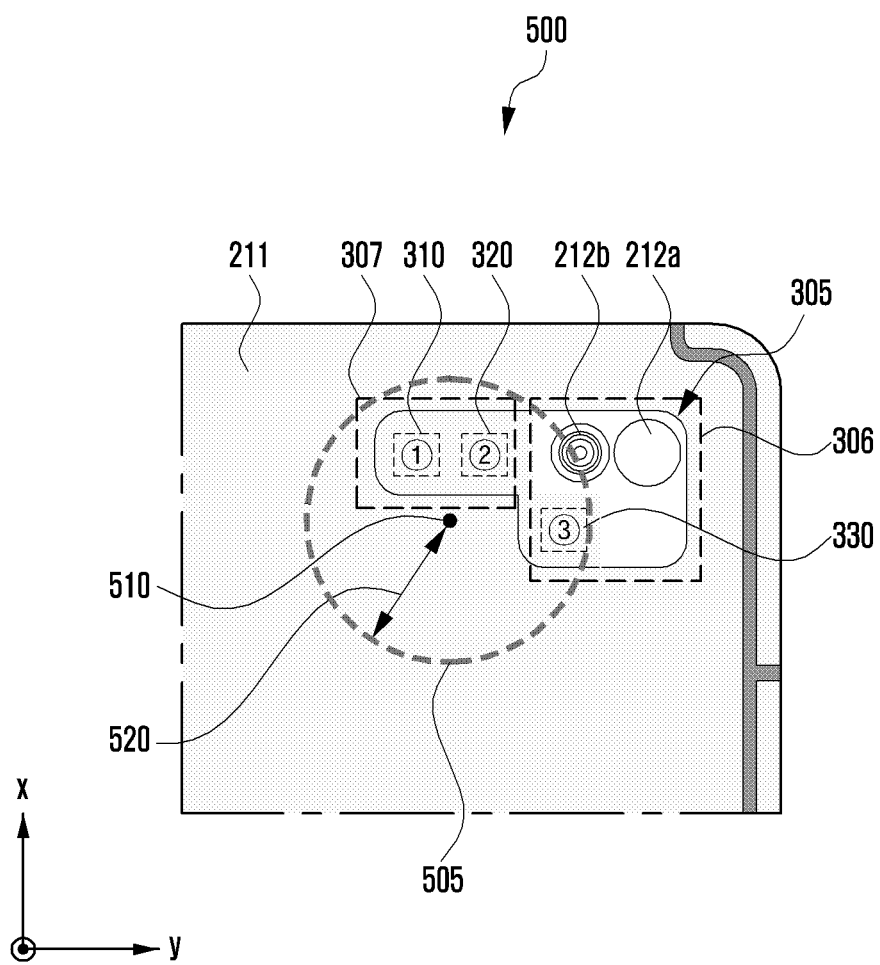
FIG. 5 is a view illustrating an arrangement of a first patch antenna to a third patch antenna in a rear plate of an electronic device according to an embodiment.

FIG. 5 is a view 500 illustrating an arrangement of a first patch antenna to a third patch antenna 310, 320, and 330 in a rear plate 211 of an electronic device 101 according to an embodiment.

Referring to FIG. 5, as described in reference numeral <410> of FIG. 4 described above, in an embodiment, the first camera 212a, the second camera 212b, and the third patch antenna 330 may be arranged inside the first region 306 of the opening 305 formed through a rear plate (e.g., the rear plate 211 of FIG. 3) of an electronic device (e.g., the electronic device 101 of FIG. 1). In an embodiment, the first patch antenna 310 and the second patch antenna 320 may be arranged inside the second region 307 of the opening 305. For example, the first patch antenna 310 and the second patch antenna 320, which are arranged inside the second region 307 of the opening 305, may be arranged to be non-aligned with the third patch antenna 330 disposed inside the first region 306 of the opening 305.

In an embodiment, a UWB antenna (e.g., the antenna module 197 of FIG. 1) may be configured such that multiple patch antennas (e.g., the first patch antenna 310, the second patch antenna 320, and the third patch antenna 330) are in a wavelength range 505 (e.g., a range whose radius is λ) for UWB frequency signals (e.g., about 3.1-10.6 GHz). For example, the positions of the patch antennas may be adjusted such that multiple patch antennas (e.g., the first patch antenna 310, the second patch antenna 320, and the third patch antenna 330) are arranged in the wavelength range 505 for the UWB frequency signal. For example, the first patch antenna 310, the second patch antenna 320, and the third patch antenna 330 may be arranged in the wavelength range 505 for a UWB frequency signal, and for example, in a designated radius 520 (e.g., 25 mm) from the center point 510 thereof.

Figure 6:
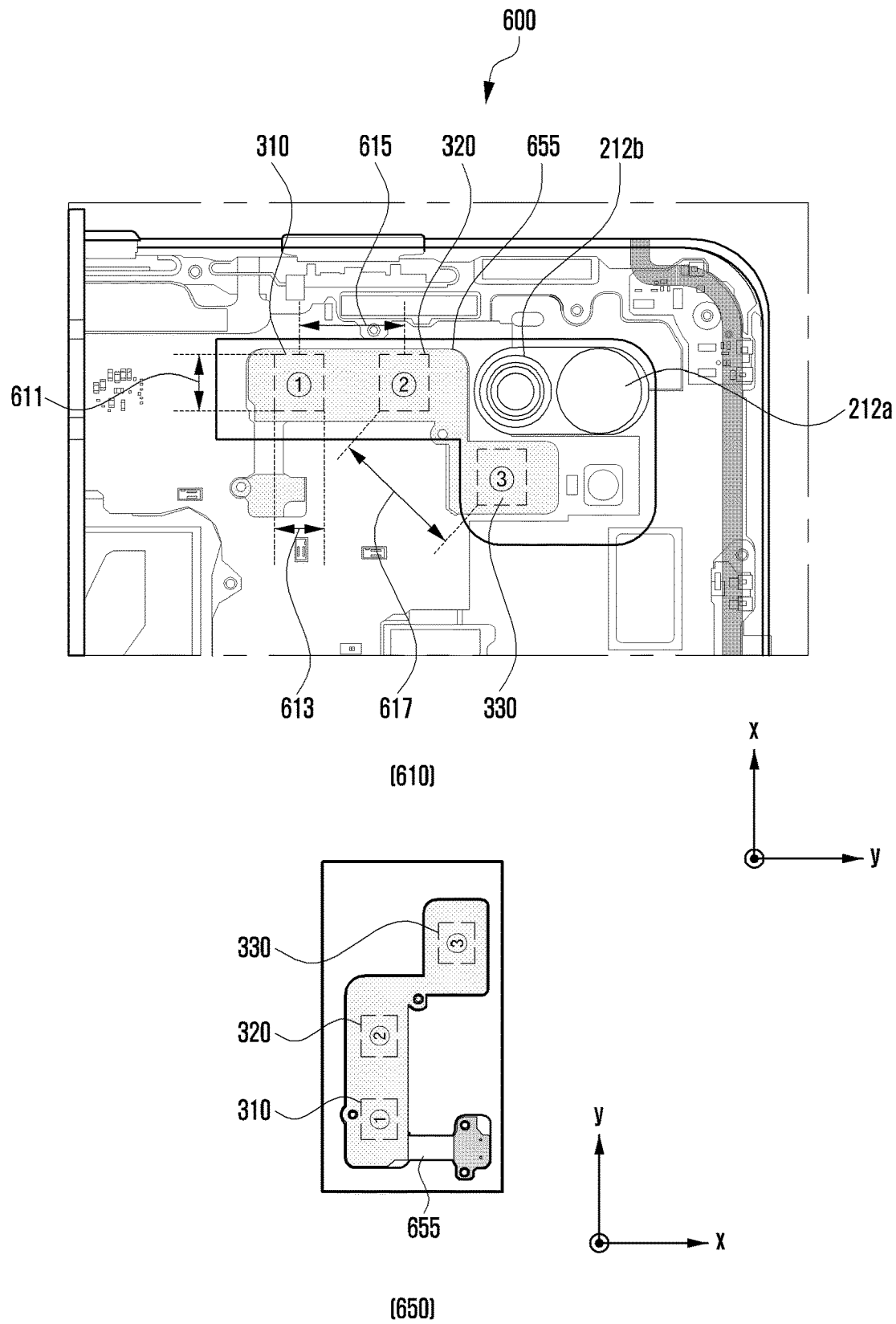
FIG. 6 is a view illustrating an arrangement of a first patch antenna to a third patch antenna in a rear plate of an electronic device according to an embodiment.

FIG. 6 is a view 600 illustrating an arrangement of a first patch antenna to a third patch antenna 310, 320, and 330 in a rear plate 211 of an electronic device 101 according to an embodiment.

Referring to reference numeral <610> of FIG. 6, as described in reference numeral <410> of FIG. 4 described above, the first camera 212*a*, the second camera 212*b*, and the third patch antenna 330 may be arranged inside the first region 306 of the opening 305 formed through a rear plate (e.g., the rear plate 211 of FIG. 3) of an electronic device (e.g., the electronic device 101 of FIG. 1). In an embodiment, the first patch antenna 310 and the second patch antenna 320 may be arranged inside the second region 307 of the opening 305. For example, the first patch antenna 310 and the second patch antenna 320, which are arranged inside the second region 307 of the opening 305, may be arranged to be non-aligned with the third patch antenna 330 disposed inside the first region 306 of the opening 305.

In an embodiment, the first patch antenna 310 may have a height 611 (e.g., about 10 mm) and a width 613 (e.g., about 8 mm). The sizes and shapes of the second patch antenna 320 and the third patch antenna 330 may be the same as the size and shape of the first patch antenna 310. For example, in order for the patch antennas to have identical performance, the sizes and shapes of the first patch antenna 310, the second patch antenna 320, and the third patch antenna 330 may be the same.

However, the instant disclosure is not so limited, and the sizes and shapes of the second patch antenna 320 and the third patch antenna 330 may be different from the size and shape of the first patch antenna 310.

For example, the sizes and shapes of the first patch antenna 310, the second patch antenna 320, and the third patch antenna 330 may be determined based on the resonance frequency band of the UWB antenna (e.g., the antenna module 197 of FIG. 1).

In an embodiment, the second patch antenna 320 may be disposed to be spaced apart from the first patch antenna 310 in the first direction (e.g., the y-axis direction). For example, the second patch antenna 320 may be disposed to be spaced apart from the first patch antenna 310 by a first distance 615 (e.g., 14 mm). The first distance 615 may refer to the distance between a feeding point of the first patch antenna 310 and a feeding point of the second patch antenna 320.

In an embodiment, the third patch antenna 330, which is disposed to be non-aligned with the first patch antenna 310 and the second patch antenna 320, may be disposed to be spaced apart from the second patch antenna 320 by a second distance 617 (e.g., 21 mm). The second distance 617 (e.g., 21 mm) may refer to a distance between a feeding point of the third patch antenna 330 and a feeding point of the second patch antenna 320.

In an embodiment, as described in FIG. 5 described above, the first patch antenna 310, the second patch antenna 320, and the third patch antenna 330 may be arranged in a wavelength range whose radius is λ of the corresponding UWB frequency signal (e.g., about 3.1-10.6 GHz).

In an embodiment, the size of each of the patch antennas 310, 320, and 330, the distances between respective patch antennas, and/or the range in which multiple patch antennas are arranged, described above, may be merely an example for easy explanation, and the size, the distances, and/or the range, described above, may not be limited thereto. For example, the size of each of the patch antennas 310, 320, and 330, the distances between respective patch antennas, and/or the arranged range may be changed to improve radiation efficiency of respective patch antennas.

Reference numeral <650> according to an embodiment is a view illustrating a flexible printed circuit board (FPCB) 655 to which the first patch antenna 310, the second patch antenna 320, and the third patch antenna 330 are mounted.

Figure 7:
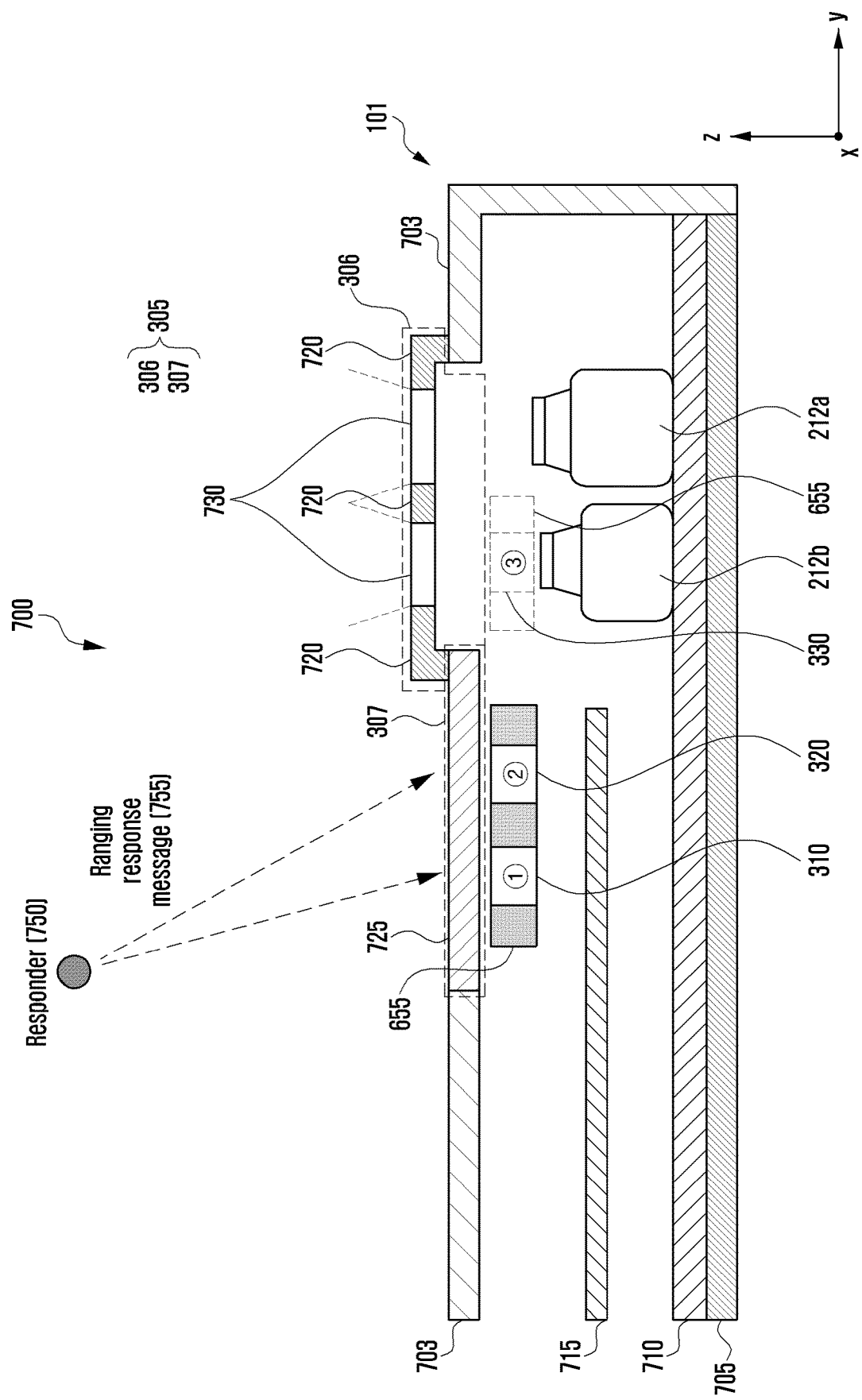
FIG. 7 is a sectional view of an electronic device along line A-A' of FIG. 3, according to an embodiment.

In an embodiment, the FPCB 655, to which the first patch antenna 310, the second patch antenna 320, and the third patch antenna 330 are mounted, may be electrically connected to a printed circuit board (e.g., the printed circuit board 715 of FIG. 7). For example, a flexible conductive member may be positioned between the printed circuit board and the FPCB 655, and the FPCB 655 may be electrically connected to the printed circuit board through the flexible conductive member. For example, the flexible conductive member may include a C clip (e.g., C-shaped spring), a pogo-pin, a spring, conductive PORON, a conductive rubber, a conductive tape, or a copper connector. In another example, the FPCB 655 may be electrically connected to the printed circuit board through a connector including a socket and a header. In an embodiment, the printed circuit board and the FPCB 655 may be coupled by a bolt (not shown), and the bolt (not shown) may electrically connect between the printed circuit board and FPCB 655. The printed circuit board and the FPCB 655 may be electrically connected through various other methods.

Figure 8:
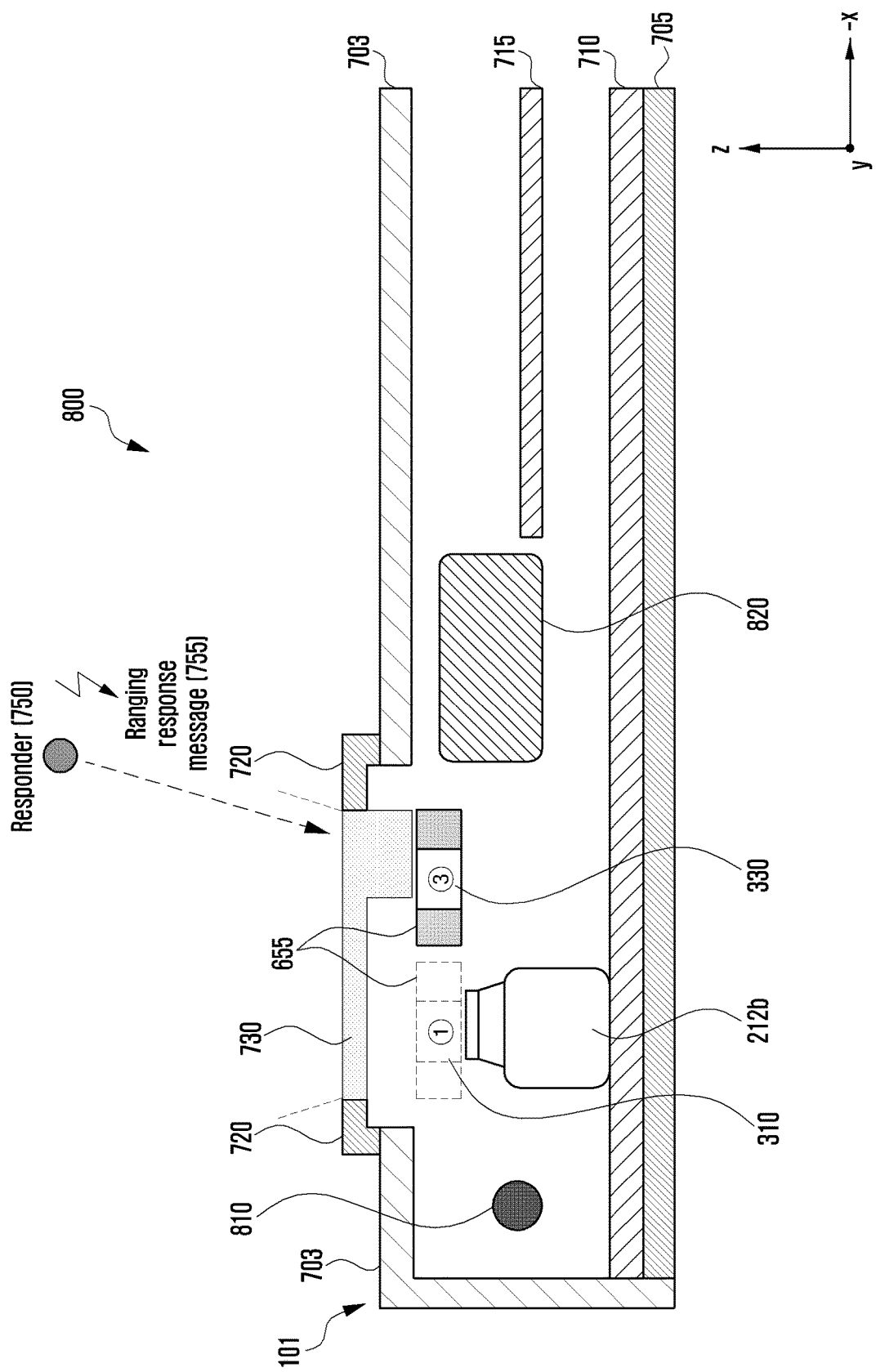
FIG. 8 is a sectional view of an electronic device along line B-B' of FIG. 3, according to an embodiment.

FIG. 7 is a sectional view 700 of an electronic device 101 along line A-A' of FIG. 3, according to an embodiment. FIG. 8 is a sectional view 800 of an electronic device 101 along line B-B' of FIG. 3, according to an embodiment.

Referring to FIG. 7 and FIG. 8, an electronic device (e.g., the electronic device 101 of FIG. 1) may include a window layer 705, and a display panel 710 (e.g., the display 201 of FIG. 2), a printed circuit board 715, and a rear plate 703 (e.g., the rear plate 211 of FIG. 3), which are sequentially arranged on the rear surface (e.g., the z-axis direction) of the window layer 705. The rear plate 211, a front plate 202, and a side member 218 of the electronic device 101 according to an embodiment may be integrally formed, and may be made of the same material (e.g., metal).

In an embodiment, the opening 305 (e.g., the opening 305 of FIG. 3) may be formed through a partial region of the rear plate 703. The opening 305 may include the first region 306 and the second region 307. The first camera 212*a*, the second camera 212*b*, and the third patch antenna 330 may be arranged inside the first region 306 of the opening 305.

In an embodiment, the rear plate 703 may include window glasses 720 and 730 which are arranged at positions corresponding to the first region 306 of the opening 305 to protect the first camera 212*a*, the second camera 212*b*, and the first patch antenna 310. For example, in the first region 306 of the opening 305, the transparent window glass 730 may be disposed at positions correspond to regions in which the first camera 212*a* and the second camera 212*b* are arranged, and in the first region 306 of the opening 305, the opaque window glass 720 may be disposed at the position corresponding to the region in which the third patch antenna 330 is disposed.

In an embodiment, the window glasses 720 and 730 may be in a shape protruding from the surface of the rear plate 703. However, the instant disclosure is not so limited.

In an embodiment, the window glasses 720 and 730 may be made of a non-conductive material.

In an embodiment, the first patch antenna 310 and the second patch antenna 320 may be arranged inside the second region 307 of the opening 305.

In an embodiment, the rear plate 703 may include an opaque injection member 725 disposed at the position corresponding to the second region 307 of the opening 305 so as to prevent the second region 307 of the opening 305 from being exposed therefrom. The injection member 725 may be coated with the same color as the rear plate 211. However, the instant disclosure is not so limited, and a cover member, which covers a camera (e.g., the first camera 212a and the second camera 212b) and is different from the glass window 730, may be coupled onto the injection member 725. In an embodiment, the injection member 725 may be non-conductive (e.g., made of plastic).

In an embodiment, the first patch antenna 310, the second patch antenna 320, and the third patch antenna 330 may be mounted onto the FPCB 655. For example, the FPCB 655, to which the first patch antenna 310, the second patch antenna 320, and the third patch antenna 330 are mounted, may be disposed between the rear plate 703 and the printed circuit board 715.

In an embodiment, the FPCB 655, to which the first patch antenna 310, the second patch antenna 320, and the third patch antenna 330 are mounted, may be electrically connected to the printed circuit board 715 through a flexible conductive member, for example, a C clip. However, the instant disclosure is not so limited.

In an embodiment, the first patch antenna 310 and the second patch antenna 320 may be arranged to be aligned with the second camera 212b in the first direction (e.g., the y-axis direction) (e.g., refer to FIG. 7). The first patch antenna 310 (and the second patch antenna 320) may be disposed to be non-aligned with the third patch antenna 330 (e.g., see FIG. 6).

In an embodiment, the remaining region of the rear plate 703 other than the opening 305 may be made of a conductive material (e.g., metal).

In an embodiment, one patch antenna of the first patch antenna 310, the second patch antenna 320, and the third patch antenna 330 may be used as the patch antenna for transmitting or receiving UWB signals, and the two remaining patch antennas may be used as patch antennas for receiving UWB signals. For example, if it is described under the assumption that the second patch antenna 320 is the patch antenna for transmitting or receiving a ranging signal, the electronic device 101 may be configured to transmit a ranging signal to an external electronic device 750 (e.g., a responder) through a communication circuit (e.g., the communication module 190 of FIG. 1) by using the second patch antenna 320. In response to transmitting a ranging signal, the electronic device 101 may be configured to receive a ranging response signal 755 from the external electronic device 750 by using the first patch antenna 310, the second patch antenna 320, and the third patch antenna 330. The electronic device 101 may be configured to measure AoA with the external electronic device 750, based on the received ranging response signal 755.

In an embodiment, a coaxial cable 810 for connecting the printed circuit board 715 and an antenna device (e.g., UWB antenna), may be further disposed inside the electronic device 101.

In an embodiment, a sound output module (e.g., the sound output module 155 of FIG. 1) for outputting sound signals, for example, a speaker 820, may be further disposed inside the electronic device 101.

Figure 9:
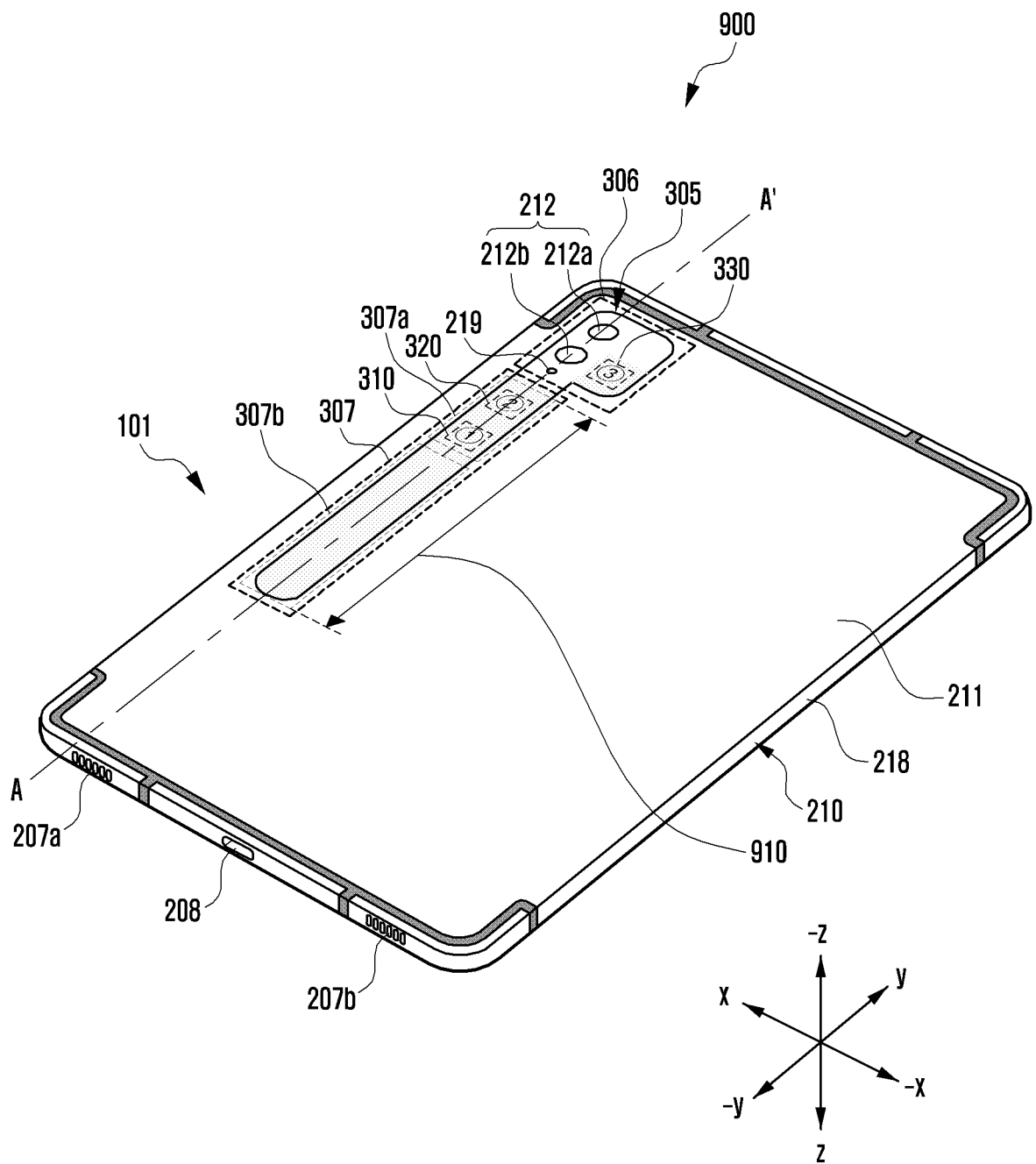
FIG. 9 is a rear perspective view of an electronic device including a pen seating part according to an embodiment.

FIG. 9 is a rear perspective 900 view of an electronic device 101 including a pen seating part, according to an embodiment.

The electronic device 101 illustrated in FIG. 9 according to an embodiment may be identical in some respects to the configuration of the electronic device 101 of FIG. 2 and FIG. 3 described above, and thus duplicative description therefor is omitted below.

Referring to FIG. 9, the opening 305 may be formed through at least a partial region of the rear plate 211 of the electronic device 101. The opening 305 may be in a polygonal shape. For example, the opening 305 may include the first region 306 having a quadrilateral shape, and the second region 307 extending from at least a part (e.g., at least a part of the fourth side 414 of FIG. 4) of the quadrilateral-shaped first region 306 in one side direction (e.g., the −y-axis direction) in a second length 910, where in this example the second length 910 is longer than the first length 340 of FIG. 4.

In an embodiment, the first camera 212a, the second camera 212b, and/or the flash 219 may be arranged inside the quadrilateral-shaped first region 306 of the opening 305. At least one UWB antenna for supporting high-frequency UWB communication, for example, the third patch antenna 330, may be disposed inside the first region 306 of the opening 305.

In an embodiment, at least other one UWB antenna for supporting high-frequency UWB communication, for example, the first patch antenna 310 and the second patch antenna 320, may be disposed inside a partial part 307a of the second region 307 of the opening 305.

In an embodiment, the first patch antenna 310 and the second patch antenna 320 may be arranged to be aligned in the first direction (e.g., the y-axis direction). The first patch antenna 310 and the second patch antenna 320, which are arranged inside the second region 307 of the opening 305, may be arranged to be non-aligned with the third patch antenna 330 disposed inside the first region 306 of the opening 305.

In an embodiment, the other partial part 307b of the second region 307 of the opening 305 may be a pen seating part on which an electronic pen (not shown) may be mounted. At least a partial region of the pen seating part may further include a wireless charging circuit (not shown) for charging the battery of the mounted electronic pen (not shown).

In an embodiment, the rear plate 211 may include a window glass disposed at the position corresponding to the first region 306 of the opening 305 to protect the first camera 212a, the second camera 212b, and the third patch antenna 330. The window glass may include a transparent window glass and an opaque window glass. For example, in the first region 306 of the opening 305, the transparent window glass may be disposed at the positions corresponding to the regions in which the first camera 212a, the second camera 212b, and the flash 219 are arranged. In the first region 306 of the opening 305, the opaque window glass may be disposed at the position corresponding to the region in which the third patch camera 330 is disposed.

In an embodiment, the rear plate 211 may include an opaque injection member disposed at the position corresponding to the second region 307 of the opening 305 so as to prevent the second region 307 of the opening 305 from being exposed therefrom.

In an embodiment, a glass window member (not shown) may be attached on the injection member configured to cover the pen seating part. For example, the opening 305 does not extend to the pen seating part, and the injection member may be configured to fill multiple different openings in the pen seating part. For example, multiple different openings included in the pen seating part may include an opening for a pen charging coil (not shown) and/or an opening for a 5G patch antenna (not shown). As described above, the glass window member may be attached on the injection member for covering multiple openings. In this case, even though the injection member and the glass window member overlap each other, there may be no interference with UWB antenna performance.

In an embodiment, the glass window and the injection member, which are arranged at a position corresponding to the opening 305 of the rear plate 211 of the electronic device 101, may be made of a non-conductive material. The remaining region of the rear plate 703 other than the opening 305 may be made of a conductive material (e.g., metal).

In an embodiment, the first patch antenna 310, the second patch antenna 320, and the third patch antenna 330 for UWB communication may be arranged inside the opening 305 of the rear plate 211, which is covered by the non-conductive glass window and the non-conductive injection member, where the remaining portion of the rear plate 211 may be made of a conductive material, and thus degradation of UWB signal quality can be prevented. Accordingly, the electronic device 101 can accurately measure AoA with an external electronic device.

Figure 10:
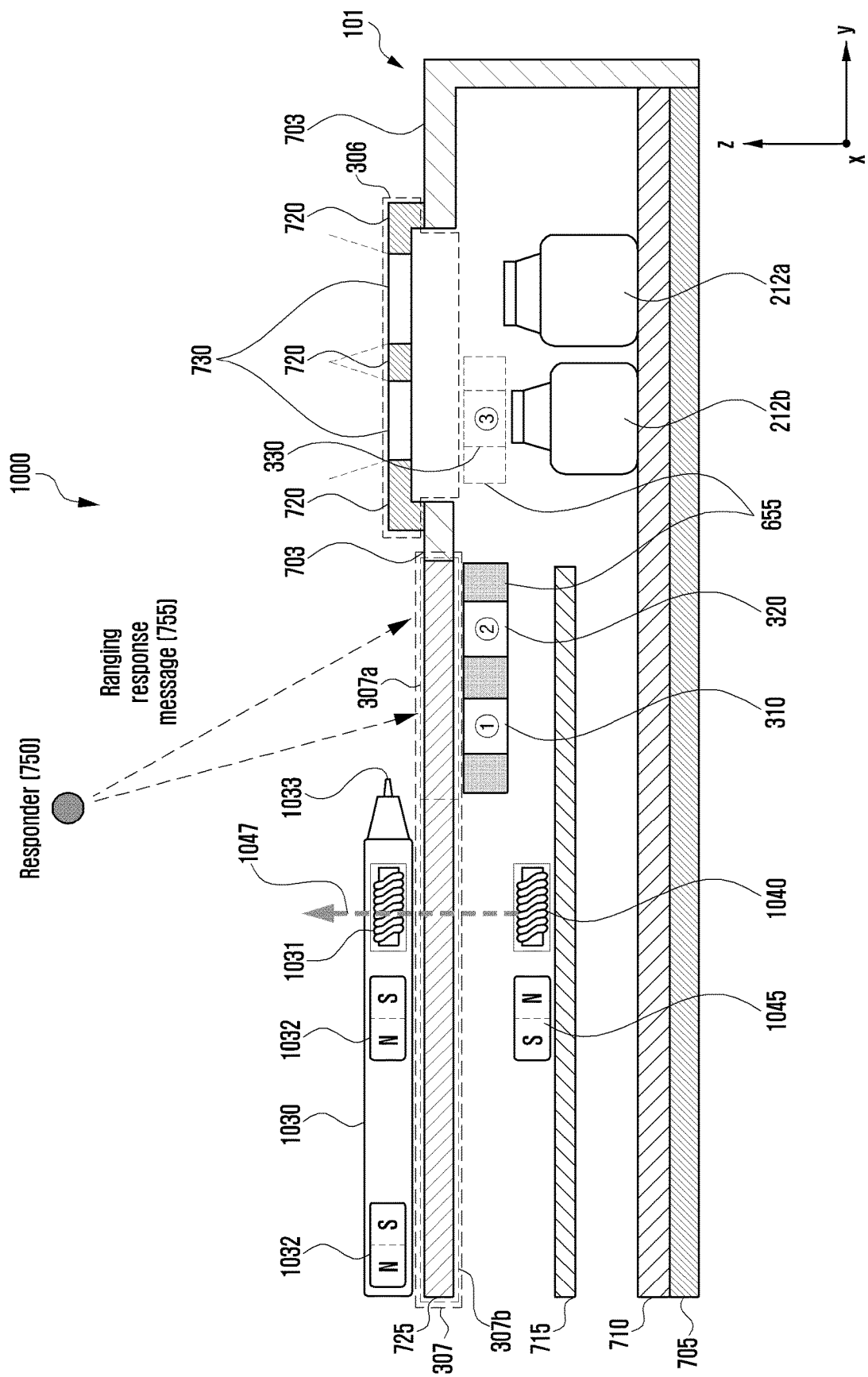
FIG. 10 is a sectional view of an electronic device including a pen seating part along line A-A' of FIG. 9, according to an embodiment.

FIG. 10 is a sectional view 1000 of an electronic device 101 including a pen seating part along line A-A' of FIG. 9, according to an embodiment.

Certain aspects of the structure of the electronic device of FIG. 10 according to an embodiment may be identical to the structure of the electronic device of FIG. 7 described above, and thus duplicative description therefor is omitted. Hereinafter, in connection with the description of FIG. 10, only the configurations different from those of FIG. 7 will be described.

Referring to FIG. 10, the opening 305 (e.g., the opening 305 of FIG. 3) may be formed through a partial region of the rear plate 703 (e.g., the rear plate 211 of FIG. 3) of an electronic device (e.g., the electronic device 101 of FIG. 1). The opening 305 may include the first region 306 and the second region 307. The first camera 212a, the second camera 212b, and the third patch antenna 330 may be arranged inside the first region 306 of the opening 305.

In an embodiment, the rear plate 703 may include the window glass 730 disposed at the position corresponding to the first region 306 of the opening 305 to protect the first camera 212a, the second camera 212b, and the third patch antenna 330. The window glass may include a transparent glass and an opaque window glass. For example, in the first region 306 of the opening 305, the transparent window glass may be disposed at positions corresponding to the regions in which the first camera 212a and the second camera 212b are arranged. In the first region 306 of the opening 305, the opaque window glass may be disposed at the position corresponding to the region in which the third patch camera 330 is disposed.

In an embodiment, at least one UWB antenna for supporting high-frequency UWB communication, for example, the first patch antenna 310 and the second patch antenna 320, may be disposed inside the partial part 307a of the second region 307 of the opening 305. In an embodiment, one patch antenna of the first patch antenna 310, the second patch antenna 320, and the third patch antenna 330 may be used as the patch antenna for transmitting or receiving UWB signals, and the two remaining patch antennas may be used as patch antennas for receiving UWB signals.

In an embodiment, the rear plate 703 may include the opaque injection member 725 disposed at the position corresponding to the second region 307 of the opening 305 so as to prevent the second region 307 of the opening 305 from being exposed therefrom. The injection member 725 may be made of a non-conductive material (e.g., plastic).

In an embodiment, the first patch antenna 310, the second patch antenna 320, and the third patch antenna 330 may be mounted onto the FPCB 655. For example, the FPCB 655, to which the first patch antenna 310, the second patch antenna 320, and the third patch antenna 330 are mounted, may be disposed between the rear plate 703 and the printed circuit board 715.

In an embodiment, the first patch antenna 310 and the second patch antenna 320 may be arranged to be aligned with the second camera 212b in the first direction (e.g., the y-axis direction). The first patch antenna 310 and the second patch antenna 320 may be arranged to be non-aligned with the third patch antenna 330.

In an embodiment, the other partial part 307b of the second region 307 of the opening 305 may be a pen seating part provided to enable the electronic pen 1030 to be mounted thereto. A coil member 1040 for charging a battery of the electronic pen 1030 may be mounted in the pen seating part, and a magnet 1045 for allowing the electronic pen 1030 to be stably seated thereon, may be included inside at least a partial region of the pen seating part. The coil member 1040 and the magnet 1045 may be arranged between the rear plate 703 and the printed circuit board 715.

In an embodiment, the electronic pen 1030 may include the magnet 1032. The electronic pen 1030 may be coupled to the magnet 1045 disposed inside the pen seating part by magnetic force of the magnet 1032, and thus may be mounted to the pen seating part. In an embodiment, the electronic pen 1030 may include the coil member 1031 for electromagnetic induction and/or wireless charging. When a magnetic field signal 1047 is generated in the coil member 1040 of the electronic device 101, a current may flow through the coil member 1031 of the electronic pen 1030 by electromagnetic induction, and thus a battery (not shown) of the electronic pen 1030 can be charged.

In an embodiment, when at least one UWB antenna for supporting UWB communication high-frequency, for example, the first patch antenna 310 and the second patch antenna 320, is disposed inside the partial part 307a of the second region 307 of the opening 305, and the electronic pen 1030 is mounted to the other partial part 307b of the second region 307, the radiation pattern of the UWB antenna may be distorted. For example, when the UWB antenna is disposed inside the opening 305 of the rear plate 701 of the electronic device 101, even though it is processed to match 0 degree through calibration, errors may occur in the AoA signal received by the electronic device 101 as electronic equipment such as the electronic pen 1030 is mounted onto the rear surface of the rear plate 703. For example, since the UWB antenna has the characteristic of a directional pattern radiating in a direction (e.g., the z-axis direction) perpendicular to the rear plate 703 onto which the UWB antenna is mounted, degradation of radiation performance of the UWB antenna may occur due to an object (e.g., the electronic pen 1030) positioned in the periphery of the electronic device 101. In order to correct the AoA error, calibration may be performed for when the electronic pen 1030 is mounted onto the pen seating part in the direction in which a pen tip 1033 of the electronic pen 1030 faces the y-axis direction, and when the electronic pen is mounted onto the pen seating part in the direction in which the pen tip 1033 of the electronic pen 1030 faces the −y-axis direction. The correction value compared to the default performance may be determined through the calibration performed under each condition. The determined correction value may be used to correct the AoA error.

In an embodiment, when the electronic pen 1030 is mounted onto the pen seating part by the coupling of the magnet 1032 and the magnet 1045 inside the pen seating part, in order to prevent degradation of radiation performance of the UWB patch antenna (e.g., the first UWB patch antenna 310), the electronic pen 1030 and the UWB patch antenna (e.g., the feeding point of the first UWB patch antenna 310) may be spaced apart by a certain distance.

In an embodiment, even when electric equipment such as the electronic pen 1030 is mounted onto the rear plate 703 of the electronic device 101, the degradation of radiation performance of the first patch antenna 310, the second patch antenna 320, and the third patch antenna 330 can be prevented by correcting for the AoA error using correction values, and/or by spacing apart the electronic pen 1030 and the UWB patch antenna (e.g., the feeding point of the first UWB patch antenna 310) by a certain distance. Therefore, the electronic device 101 may effectively perform ultra-wide band communication by using the first patch antenna 310, the second patch antenna 320, and the third patch antenna 330.

Figure 11:
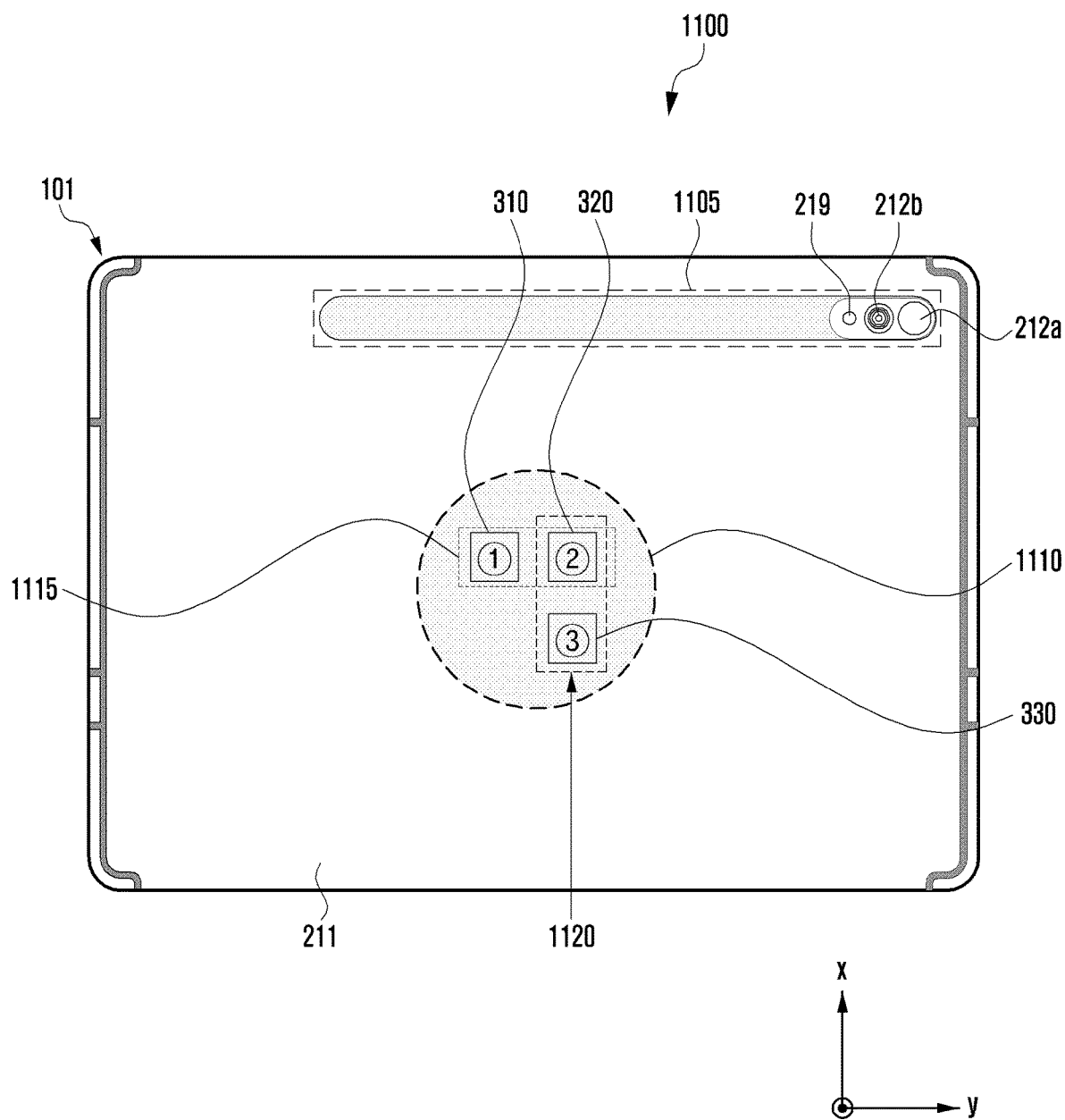
FIG. 11 is a view illustrating an arrangement of a first patch antenna to a third patch antenna according to an embodiment.

FIG. 11 is a view 1100 illustrating an arrangement of a first patch antenna to a third patch antenna 310, 320, and 330 according to an embodiment.

In FIG. 2 to FIG. 10 described above, it is described that the first patch antenna 310, the second patch antenna 320, or the third patch antenna 330 may be arranged inside the first region 306 of the opening 305 formed to allow a camera (e.g., the first camera 212a and the second camera 212b of FIG. 3) to be disposed on a rear plate (e.g., the rear plate 211 of FIG. 3) of an electronic device (e.g., the electronic device 101 of FIG. 1) and the second region 307 extending from a part of the first region 306 in one side direction (e.g., the −y-axis direction), but the instant disclosure is not so limited.

Referring to FIG. 11 according to an embodiment, a first opening 1105 (e.g., the opening 305 of FIG. 3) and a second opening 1110 spaced apart from the first opening 1105 may be formed through the rear plate 211 of the electronic device 101.

In an embodiment, the second opening 1110 may be an opening formed to allow other elements such as the manufacturer's logo to be exposed therefrom. However, the instant disclosure is not so limited.

In an embodiment, the first camera 212a, the second camera 212b, and/or the flash 219 may be arranged inside a partial region of the first opening 1105. A pen seating part for mounting an electronic pen (e.g., the electronic pen 1030 of FIG. 10) may be formed in the other partial region of the first opening 1205.

In an embodiment, the first patch antenna 310, the second patch antenna 320, and the third patch antenna 330 may be arranged inside the second opening 1110. In an embodiment, one patch antenna of the first patch antenna 310, the second patch antenna 320, and the third patch antenna 330 may be used as the patch antenna for transmitting or receiving UWB signals, and the two remaining patch antennas may be used as patch antennas for receiving UWB signals.

In an embodiment, the rear plate 211 may include an opaque injection member disposed at the position corresponding to the second opening 1110. For example, in order to prevent the second opening 1110 from being exposed therefrom, the opaque injection member may be disposed at the position corresponding to the second opening 1110.

In an embodiment, in order to measure AoA with an external electronic device (e.g., the external electronic device 750 of FIG. 7), the first patch antenna 310, the second patch antenna 320, and the third patch antenna 330 may be arranged inside the second opening 1210 in a "⌐" shape or a "⌊" shape. For example, the first patch antenna 310 and the second patch antenna 320 may be arranged inside the second opening 1210 to be aligned in the first direction (e.g., the y-axis direction). The third patch antenna 330 may be disposed below (e.g., the −x-axis direction) the second patch antenna 320. For example, the second patch antenna 320 and the third patch antenna 330 may be arranged inside the second opening 1210 to be aligned in the second direction (e.g., the −x-axis direction) perpendicular to the first direction (e.g., the y-axis direction). In other words, the third patch antenna 330 may be disposed to be non-aligned with the first patch antenna 310 and the second patch antenna 320.

In an embodiment, the first patch antenna 310 and the second patch antenna 320, which are arranged inside the second opening 1110 to be aligned in the first direction (e.g., the y-axis direction), may be used for measuring a horizontal angle 1115 (e.g., azimuth angle of AoA). In an embodiment, the second patch antenna 320 and the third patch antenna 330, which are arranged inside the second opening 1110 to be aligned in the second direction (e.g., the −x-axis direction) perpendicular to the first direction (e.g., the y-axis direction), may be used for measuring a vertical angle 1120 (e.g., elevation angle of AoA).

For example, a ranging signal may be transmitted to the external electronic device 750 by using one patch antenna of the first patch antenna 310, the second patch antenna 320, and the third patch antenna 330. The electronic device 101, in response to the transmitted ranging signal, may measure AoA with the external electronic device 750, based on a ranging response signal (e.g., the ranging response signal 755 of FIG. 7) received using the first patch antenna 310, the second patch antenna 320, and/or the third patch antenna 330. For example, the electronic device 101, based on a response signal received through the first patch antenna 310 and the second patch antenna, may measure the angle in the horizontal direction, and based on a response signal received through the second patch antenna 320 and the third patch antenna 330, may measure the angle in the vertical direction. Therefore, the electronic device 101 may measure 360 degrees of AoA with the external electronic device 750.

In an embodiment, the electronic device 101, based on the orientation of the electronic device 101, may be configured to activate two patch antennas for measuring the azimuth angle of AoA or the elevation angle of AoA.

For example, when the orientation of electronic device 101 is the portrait mode, the electronic device 101 may be configured to measure an angle (e.g., angle in the x-axis direction or azimuth angle of AoA) in a horizontal direction by using the second patch antenna 320 and the third patch antenna 330. When it is detected through the sensor circuit 176 that the electronic device 101 is reoriented into the landscape mode, the electronic device 101 may be configured to switch the patch antenna activated such that an angle (e.g., angle in the y-axis direction or azimuth angle of AoA) in the horizontal direction is measured using the first patch antenna 310 and the second patch antenna 320.

In another example, when the orientation of electronic device 101 is the portrait mode, the electronic device 101 may be configured to measure an angle (e.g., angle in the y-axis direction or elevation angle of AoA) in a vertical direction by using the first patch antenna 310 and the second patch antenna 320. When it is detected through the sensor circuit 176 that the electronic device 101 is reoriented into the landscape mode, the electronic device 101 may be configured to switch the patch antenna activated such that an angle (e.g., angle in the x-axis direction or elevation angle of AoA) in the vertical direction is measured using the second patch antenna 320 and the third patch antenna 330.

In an embodiment, in order to expose another element (e.g., the manufacturer's logo) other than the first opening 1105 formed to allow a camera (e.g., the first camera 212a and the second camera 212b of FIG. 3) and/or the flash 219 provided on the rear plate 211 of the electronic device 101 to be arranged therein, the first patch antenna 310, the second patch antenna 320, and the third patch antenna 330 may be arranged using the second opening 1110 covered by an injection member made of a non-conductive material. Therefore, according to this arrangement, inside already existing openings (e.g., the first opening 1105 and the second opening 1110) and without need additional separate openings, the first patch antenna 310, the second patch antenna 320, and the third patch antenna 330 can be disposed, and even though the rear plate 211 is made of a conductive material (e.g., metal), stable UWB communication can be performed to accurately measure 360 degrees of AoA with the external electronic device 750.

Figure 12:
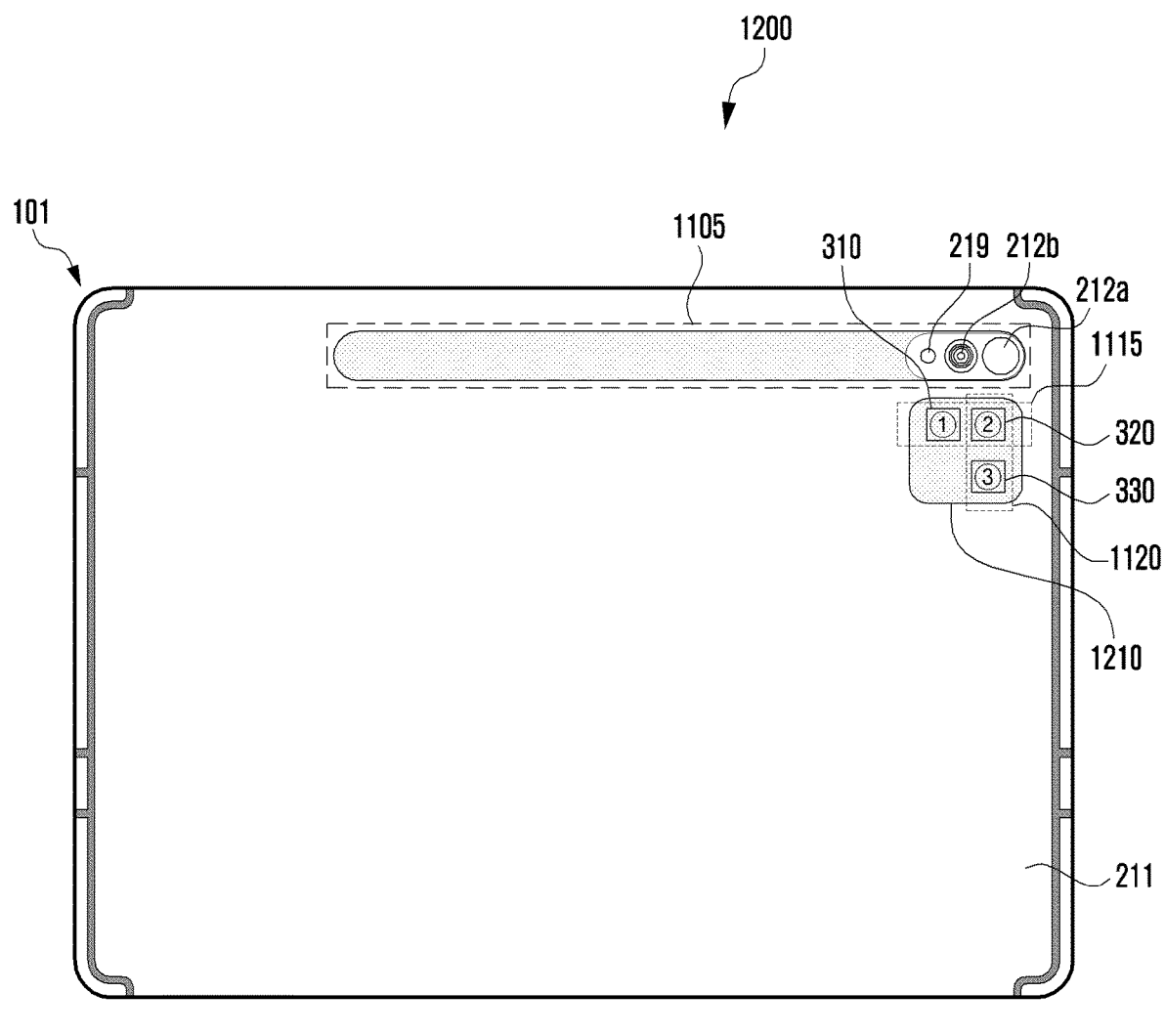
FIG. 12 is a view illustrating an arrangement of a first patch antenna to a third patch antenna according to an embodiment.

FIG. 12 is a view 1200 illustrating an arrangement of a first patch antenna to a third patch antenna 310, 320, and 330 according to an embodiment.

In FIG. 11 described above, even though it is described that the first patch antenna 310, the second patch antenna 320, and the third patch antenna 330 are arranged inside the opening (e.g., the second opening 1110) formed through the rear plate (e.g., the rear plate 211 of FIG. 3) of the electronic device (e.g., the electronic device 101 of FIG. 1), the instant disclosure is not so limited.

Referring to FIG. 12 according to an embodiment, the electronic device 101, in the rear plate 211, may include a second opening 1210 which is separate from the first opening 1105 formed to allow a camera (e.g., the first camera 212a and the second camera 212b of FIG. 3) and/or the flash 219 to be arranged therein. The second opening 1210 may be formed below (e.g., the −x-axis direction) the first opening 1105 and spaced apart therefrom by a predetermined interval.

In an embodiment, the first patch antenna 310, the second patch antenna 320, and the third patch antenna 330 may be arranged inside the second opening 1210. The rear plate 211 may include an opaque injection member disposed at a position corresponding to the second opening 1210 so as to prevent the second opening 1210 from being exposed therefrom.

In an embodiment, in order to measure AoA with an external electronic device (e.g., the external electronic device 750 of FIG. 7), the first patch antenna 310, the second patch antenna 320, and the third patch antenna 330 may be arranged inside the second opening 1210 in a "¬" shape or a " ∟ " shape. For example, the first patch antenna 310 and the second patch antenna 320 may be arranged inside the second opening 1210 to be aligned in the first direction (e.g., the y-axis direction). The first patch antenna 310 and the second patch antenna 320 may be used for measuring the horizontal angle 1115. The second patch antenna 320 and the third patch antenna 330 may be arranged inside the second opening 1210 to be aligned in the second direction (e.g., the −x-axis direction) perpendicular to the first direction (e.g., the y-axis direction). The second patch antenna 320 and the third patch antenna 330 may be used for measuring the vertical angle 1120.

In an embodiment, by forming the second opening 1210 separately from the first opening 1105 through the rear plate 211 of the electronic device 101 and arranging, inside the formed second opening 1210, the first patch antenna 310, the second patch antenna 320, and the third patch antenna 330, even though the rear plate 211 is made of a conductive material (e.g., a metal), the electronic device 101 can accurately measure 360 degrees of AoA with the external electronic device 750.

Figure 13:
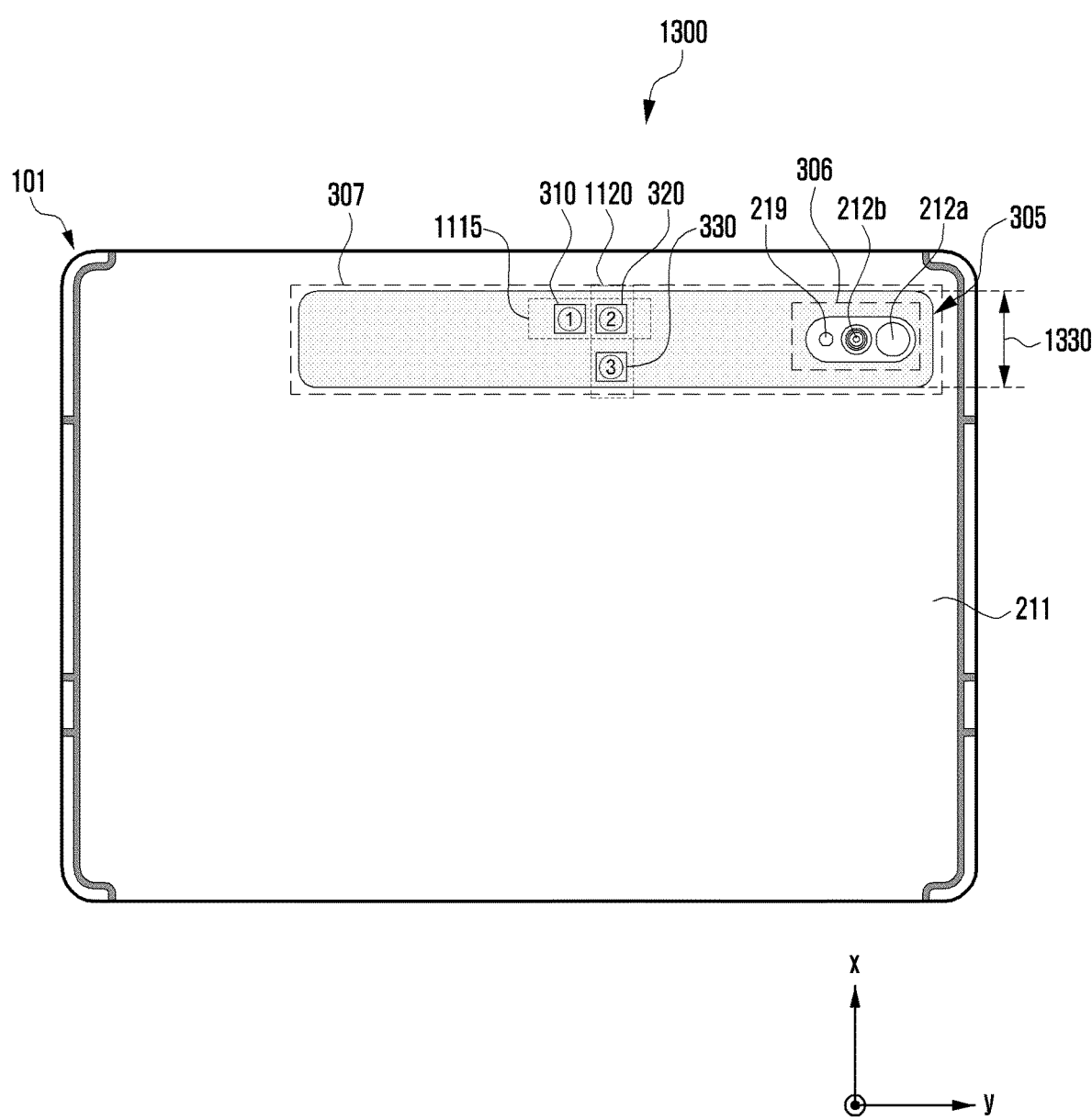
FIG. 13 is a view illustrating an arrangement of a first patch antenna to a third patch antenna according to an embodiment.

FIG. 13 is a view 1300 illustrating an arrangement of a first patch antenna to a third patch antenna 310, 320, and 330 according to an embodiment.

Referring to FIG. 13, the opening 305 formed through a rear plate (e.g., the rear plate 211 of FIG. 3) of an electronic device (e.g., the electronic device 101 of FIG. 1) may include the first region 306 having a quadrilateral shape and the second region 307 extending in one side direction (e.g., the −y-axis direction) and a direction (e.g., the x-axis and/or the −x-axis directions) perpendicular to the one side direction (e.g., the −y-axis direction), from one or more side surfaces of the first region 306.

In an embodiment, the rear plate 211 may be made of a conductive material. The rear plate 211 may include a transparent window glass disposed at the position corresponding to the first region 306 of the opening 305, the transparent window glass may be made of a non-conductive material. The rear plate 211 may include an opaque injection member disposed at the position corresponding to the second region 307 of the opening 305, the opaque injection member may be made of a non-conductive material.

In an embodiment, the opening 305 according to FIG. 13 may extend in one side direction (e.g., the −y-axis direction) and a direction (e.g., the x-axis and/or the −x-axis direction) perpendicular to the one side direction (e.g., the −y-axis direction), and thus the height 1330 of the opening 305 according to FIG. 13 may be greater than the height of the opening 305 according to FIG. 9 described above.

In an embodiment, the first patch antenna 310, the second patch antenna 320, and the third patch antenna 330 may be arranged inside a partial region (e.g., central region) of the second region 307 of the opening 305.

In an embodiment, the first patch antenna 310 and the second patch antenna 320 may be arranged inside the partial region (e.g., central region) of the second region 307 of the opening 305 to be aligned in a first direction (e.g., the y-axis direction). The third patch antenna 330 may be disposed below (e.g., the −x-axis direction) the second patch antenna 320. For example, the second patch antenna 320 and the third patch antenna 330 may be arranged inside the partial region (e.g., central region) of the second region 307 of the opening 305 to be aligned in the second direction (e.g., the −x-axis direction) perpendicular to the first direction (e.g., the y-axis direction).

In an embodiment, the electronic device 101, based on the orientation of the electronic device 101, may be configured to activate two patch antennas for measuring the azimuth angle of AoA or the elevation angle of AoA. For example, when the orientation of electronic device 101 is the portrait mode, the electronic device 101 may be configured to measure an angle (e.g., angle in the x-axis direction or azimuth angle of AoA) in a horizontal direction by using the second patch antenna 320 and the third patch antenna 330. When it is detected through the sensor circuit 176 that the electronic device 101 is reoriented into the landscape mode, the electronic device 101 may be configured to switch the patch antenna activated such that the angle 1115 (e.g., angle in the y-axis direction or azimuth angle of AoA) in the horizontal direction is measured using the first patch antenna 310 and the second patch antenna 320. For another example, when the orientation of electronic device 101 is the portrait mode, the electronic device 101 may be configured to measure an angle (e.g., angle in the y-axis direction or elevation angle of AoA) in a vertical direction by using the first patch antenna 310 and the second patch antenna 320. When it is detected through the sensor circuit 176 that the electronic device 101 is reoriented into the landscape mode, the electronic device 101 may be configured to switch the patch antenna activated such that the angle 1120 (e.g., angle in the x-axis direction or elevation angle of AoA) in the vertical direction is measured using the second patch antenna 320 and the third patch antenna 330.

In an embodiment, the third patch antenna 330 may be disposed below (e.g., the −x-axis direction) of the second patch antenna 320, and thus may be non-aligned with the first patch antenna 310 and the second patch antenna 320.

Figure 14:
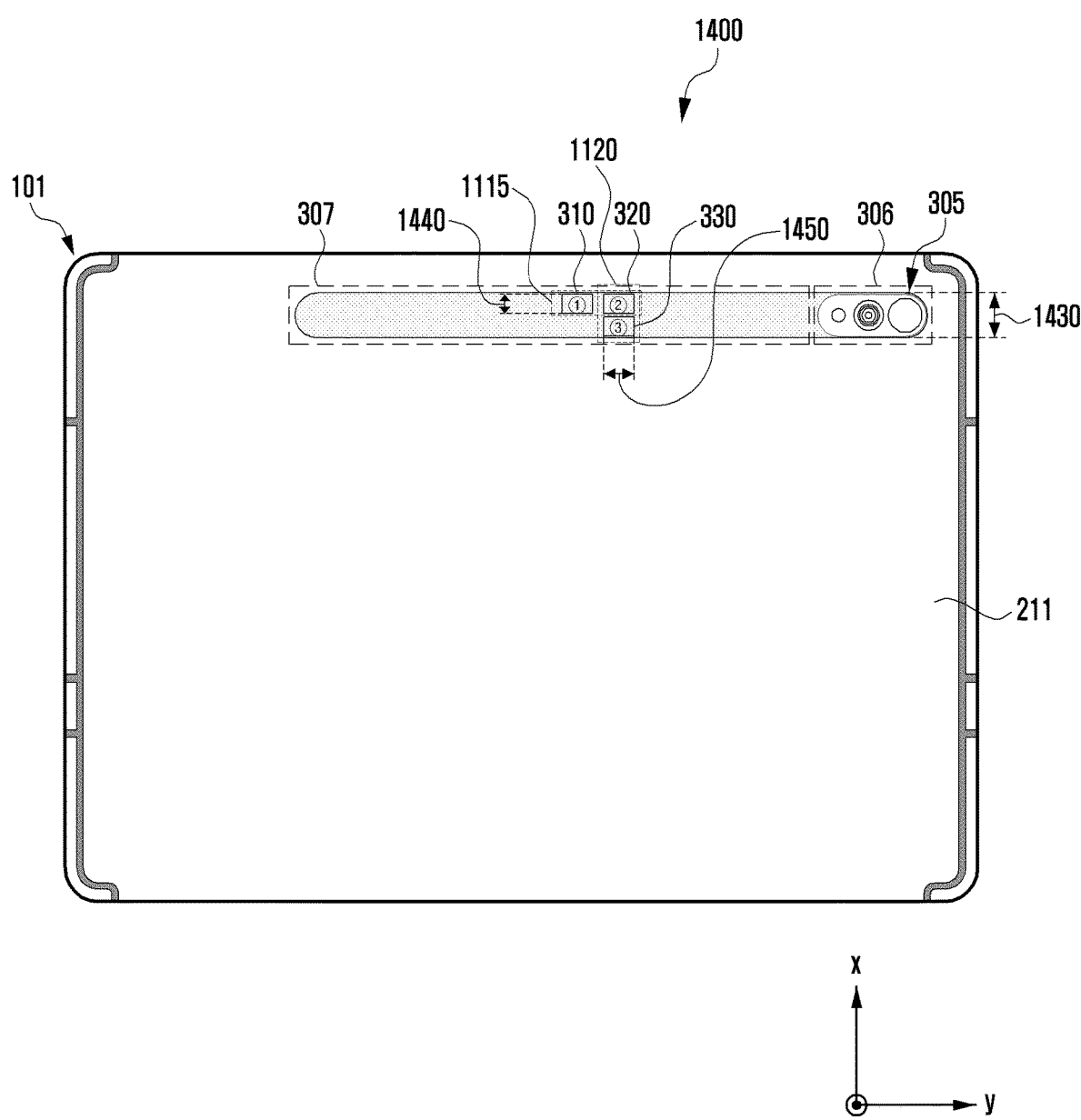
FIG. 14 is a view illustrating an arrangement of a first patch antenna to a third patch antenna according to an embodiment.

FIG. 14 is a view 1400 illustrating an arrangement of a first patch antenna to a third patch antenna 310, 320, and 330 according to an embodiment.

In FIG. 14 according to an embodiment, certain aspects of the arrangement of the first patch antenna 310, the second patch antenna 320, and the third patch antenna 330 may be the same as that of FIG. 13 described above, and thus duplicative description therefor is omitted below.

Referring to FIG. 14, compared to FIG. 13, the opening 305 formed through a rear plate (e.g., the rear plate 211 of FIG. 3) of an electronic device (e.g., the electronic device 101 of FIG. 1) may include the first region 306 having a quadrilateral shape and the second region 307 extending in one side direction (e.g., the −y-axis direction) from one side surface of the first region 306. The second region 307 may also have a quadrilateral shape.

For example, the opening 305 according to FIG. 14 may have similar size and shape as the opening 305 illustrated in FIG. 9 described above. Therefore, the height 1430 of the opening 305 according to FIG. 14 may be smaller than the height 1330 of the opening 305 according to FIG. 13. In other words, the opening 305 according to FIG. 14, compared to the opening 305 according to FIG. 13, may not extend in the direction (e.g., the x-axis and/or the −x-axis direction) perpendicular to the one side direction (e.g., the −y-axis direction), and thus the height 1430 of the opening 305 according to FIG. 14 may be smaller than the height 1330 of the opening 305 according to FIG. 13.

In an embodiment, the sizes and shapes of the first patch antenna 310, the second patch antenna 320, and the third patch antenna 330 may be determined based on a resonance frequency band of the UWB antenna (e.g., the antenna module 197 of FIG. 1).

In an embodiment, the height 1430 of the opening 305 according to FIG. 14 may be smaller than the height 1330 of the opening 305 according to FIG. 13, and when the same resonance frequency band is used, the sizes of the first patch antenna 310, the second patch antenna 320, and the third patch antenna 330, which are arranged inside a partial region (e.g., central region) of the second region 307 of the opening 305, may be different from the sizes of the first patch antenna 310, the second patch antenna 320, and the third patch antenna 330 of FIG. 3 to FIG. 13 described above.

For example, as described in FIG. 6 described above, the first patch antenna 310 may have a height 611 (e.g., about 10 mm) and a width 613 (e.g., about 8 mm). The height 1440 of the first patch antenna 310 illustrated in FIG. 14 may be smaller than the height 611 (e.g., about 10 mm) of the first patch antenna 310 illustrated in FIG. 6. The width 1450 of the first patch antenna 310 illustrated in FIG. 14 may be greater than the width 613 (e.g., about 8 mm) of the first patch antenna 310 illustrated in FIG. 6.

In an embodiment, in order to provide the same antenna performance, the sizes and shapes of the second patch antenna 320 and the third patch antenna 330 illustrated in FIG. 14 may be the same as the size and shape of the first patch antenna 310 illustrated in FIG. 14.

In FIG. 13 and FIG. 14 according to different embodiments, the sizes and shapes of the first patch antenna 310, the second patch antenna 320, and the third patch antenna 330 may be determined based on the resonance frequency band of the antenna, and may be arranged inside the second region 307 of the opening 305 of the rear plate 211, which is covered by the injection member made of a non-conductive member. The remaining portions of the rear plate 211 of the electronic device 101 other than the opening 305 may be made of a conductive material, and thus degradation of radiation performance of a UWB antenna can be prevented. Therefore, the electronic device 101 can accurately measure distance from and/or AoA with an external electronic device.

In an embodiment, an electronic device 101 may include a first camera (e.g., the first camera 212a of FIG. 3) and a second camera (e.g., the second camera 212b of FIG. 3), a communication circuit (e.g., the communication module 190 of FIG. 1), a display (e.g., the display module 160 of FIG. 1), a rear plate (e.g., the rear plate 211 of FIG. 3) disposed opposite to the display 160, an opening (e.g., the opening 305 of FIG. 3) formed in a partial region of the rear plate including a first region (e.g., the first region 306 of FIG. 3) in which the first camera 212a and the second camera 212b are disposed, and a second region (e.g., the second region 307 of FIG. 3) configured to extend from at least a part of the first region 306, a first patch antenna 310 disposed inside the first region 306 and disposed adjacent to the second camera 212b, and a second patch antenna 320 disposed inside the second region 307 and a third patch antenna 330 disposed to be aligned with the second patch antenna 320 in a first direction (e.g., the y-axis direction of FIG. 3), wherein the first patch antenna 310, the second patch antenna 320, and the third patch antenna 330 may be arranged to be non-aligned.

In an embodiment, the opening 305 may be in a polygonal shape.

In an embodiment, the rear plate 211 may include a window glass disposed at a first position corresponding to the first region 306 of the opening 305.

In an embodiment, the window glass may include a transparent window glass and an opaque window glass, the transparent window glass, in the first region 306 of the opening 305, may be disposed at a second position corresponding to a first sub-region in which the first camera 212a and the second camera 212b are disposed, and the opaque window glass, in the first region 306 of the opening 305, may be disposed at a third position corresponding to a second sub-region in which the first patch antenna 310 is disposed.

In an embodiment, the rear plate 211 may include an opaque injection member disposed at a fourth position corresponding to the second region 307 of the opening 305.

In an embodiment, the injection member may be coated with the same color as the rear plate 211, or may have a cover member coupled thereto, the cover member being different from the transparent window glass.

In an embodiment, the rear plate 211 may be made of a conductive material.

In an embodiment, the first camera 212a and the second camera 212b may be disposed to be aligned with the second patch antenna 320 and the third patch antenna 330.

In an embodiment, the second patch antenna 320 may be aligned with the first camera 212a in a second direction (e.g., the −x-axis direction of FIG. 3) perpendicular to the first direction (e.g., the y-axis direction of FIG. 3) instead of being disposed to be aligned with the third patch antenna 330 in the first direction (e.g., the y-axis direction of FIG. 3).

In an embodiment, when the second patch antenna 320 is aligned with the first camera 212a in the second direction (e.g., the −x-axis direction of FIG. 3), the first patch antenna 310 may be disposed to be aligned with the second patch antenna 320, and the third patch antenna 330 may be disposed to be non-aligned with the first patch antenna 310 and the second patch antenna 320.

In an embodiment, the second patch antenna 320 may be aligned with (e.g., the −x-axis direction of FIG. 3) the third patch antenna 330 in a second direction perpendicular to the first direction instead of being aligned with the third patch antenna 330 in the first direction.

In an embodiment, when the second patch antenna 320 is aligned with the third patch antenna 330 in the second direction, the first patch antenna 310 and the second patch antenna 320 may be disposed to be aligned in the first direction (e.g., the y-axis direction of FIG. 3).

In an embodiment, the electronic device 101 may include a flexible printed circuit board (FPCB) (e.g., the FPCB 655 of FIG. 6) disposed between the display 160 and the rear plate 211, wherein the first patch antenna 310, the second patch antenna 320, and the third patch antenna 330 may be mounted to the FPCB 655.

In an embodiment, the electronic device 101 may include a printed circuit board disposed between the display 160 and the FPCB 655.

In an embodiment, the FPCB 655 may be electrically connected to the printed circuit board through a flexible conductive member.

In an embodiment, the first patch antenna 310, the second patch antenna 320, and the third patch antenna 330 may be configured to support high-frequency ultra-wide band (UWB) communication.

In an embodiment, the first patch antenna 310, the second patch antenna 320, and the third patch antenna 330 are disposed within a wavelength range of the high-frequency UWB communication.

In an embodiment, the electronic device 101 may further include a second opening (e.g., the second opening 1110 of FIG. 11 and the second opening 1210 of FIG. 12) formed to be spaced apart from the opening 305 in the rear plate 211.

In an embodiment, the first patch antenna 310, the second patch antenna 320, and the third patch antenna 330 may be disposed in the second opening 1110 instead of being disposed in the first region 306 and the second region 307 of the opening 305.

In an embodiment, the electronic device 101 may further include a processor (e.g., the processor 120 of FIG. 1), wherein the processor 120 may be configured to transmit a ranging signal through the communication circuit 190 by using one patch antenna among the first patch antenna 310, the second patch antenna 320, and the third patch antenna 330, and measure, in response to the ranging signal, an angle of arrival (AoA) with an external electronic device (e.g., the external electronic device 750 of FIG. 7), based on a ranging response signal received through the first patch antenna 310, the second patch antenna 320, and/or the third patch antenna 330.

Certain embodiments of the disclosure disclosed in this specification and the drawings are merely specific examples presented in order to easily describe technical details of the disclosure and to help the understanding of the disclosure, and are not intended to limit the scope of the disclosure. Therefore, it should be interpreted that, in addition to the embodiments disclosed herein, all modified and changed forms derived based on the technical idea of the disclosure fall within the scope of the disclosure.

What is claimed is:

1. An electronic device comprising:
a first camera and a second camera;
a communication circuit;
a display;
a rear plate disposed opposite to the display;
an opening formed in a partial region of the rear plate including a first region in which the first camera and the second camera are disposed, and a second region configured to extend from at least a part of the first region;
a first patch antenna disposed inside the first region and disposed adjacent to the second camera; and
a second patch antenna disposed inside the second region and a third patch antenna disposed to be aligned with the second patch antenna in a first direction,
wherein the first patch antenna, the second patch antenna, and the third patch antenna are arranged to be non-aligned.

2. The electronic device of claim 1, wherein the opening is in a polygonal shape.

3. The electronic device of claim 1, wherein the rear plate further comprises a window glass disposed at a first position corresponding to the first region of the opening.

4. The electronic device of claim 3, wherein the window glass further comprises a transparent window glass and an opaque window glass,
wherein the transparent window glass, in the first region of the opening, is disposed at a second position corresponding to a first sub-region in which the first camera and the second camera are disposed, and
wherein the opaque window glass, in the first region of the opening, is disposed at a third position corresponding to a second sub-region in which the first patch antenna is disposed.

5. The electronic device of claim 4, wherein the rear plate further comprises an opaque injection member disposed at a fourth position corresponding to the second region of the opening.

6. The electronic device of claim 5, wherein the injection member is coated with same color as the rear plate, or has a cover member coupled thereto, the cover member being different from the transparent window glass.

7. The electronic device of claim 1, wherein the rear plate is made of a conductive material.

8. The electronic device of claim 1, wherein the first camera and the second camera are disposed to be aligned with the second patch antenna and the third patch antenna.

9. The electronic device of claim 1, wherein the second patch antenna is aligned with the first camera in a second direction perpendicular to the first direction instead of being disposed to be aligned with the third patch antenna in the first direction.

10. The electronic device of claim 9, wherein when the second patch antenna is aligned with the first camera in the second direction, the first patch antenna is disposed to be aligned with the second patch antenna, and the third patch antenna is disposed to be non-aligned with the first patch antenna and the second patch antenna.

11. The electronic device of claim 1, wherein the second patch antenna is aligned with the third patch antenna in a second direction perpendicular to the first direction instead of being aligned with the third patch antenna in the first direction.

12. The electronic device of claim 11, wherein when the second patch antenna is aligned with the third patch antenna in the second direction, the first patch antenna and the second patch antenna are disposed to be aligned in the first direction.

13. The electronic device of claim 1, further comprising a flexible printed circuit board (FPCB) disposed between the display and the rear plate,
wherein the first patch antenna, the second patch antenna, and the third patch antenna are mounted to the FPCB.

14. The electronic device of claim 13, further comprising a printed circuit board disposed between the display and the FPCB.

15. The electronic device of claim 14, wherein the FPCB is electrically connected to the printed circuit board through a flexible conductive member.

16. The electronic device of claim 1, wherein the first patch antenna, the second patch antenna, and the third patch antenna are configured to support high-frequency ultra-wide band (UWB) communication.

17. The electronic device of claim 16, wherein the first patch antenna, the second patch antenna, and the third patch antenna are disposed within a wavelength range of the high-frequency UWB communication.

18. The electronic device of claim 1, further comprising a second opening formed to be spaced apart from the opening in the rear plate.

19. The electronic device of claim 18, wherein the first patch antenna, the second patch antenna, and the third patch antenna are disposed in the second opening instead of being disposed in the first region and the second region of the opening.

20. The electronic device of claim 1, further comprising a processor,
wherein the processor is configured to:
transmit a ranging signal through the communication circuit by using one patch antenna among the first patch antenna, the second patch antenna, and the third patch antenna, and
measure, in response to the ranging signal, an angle of arrival (AoA) with an external electronic device, based on a ranging response signal received through the first patch antenna, the second patch antenna, and/or the third patch antenna.

* * * * *